US012254244B1

United States Patent
Veiga et al.

(10) Patent No.: US 12,254,244 B1
(45) Date of Patent: Mar. 18, 2025

(54) 2D FLOORPLAN PIPELINE AND REFINEMENT

(71) Applicant: Apple Inc., Cupertino, CA (US)

(72) Inventors: Alexandre Da Veiga, San Francisco, CA (US); Afshin Dehghan, Sunnyvale, CA (US); Amit Jain, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 902 days.

(21) Appl. No.: 17/234,898

(22) Filed: Apr. 20, 2021

Related U.S. Application Data

(60) Provisional application No. 63/014,971, filed on Apr. 24, 2020.

(51) Int. Cl.
*G06F 30/13* (2020.01)
*G06T 7/50* (2017.01)
*G06T 7/70* (2017.01)
*G06T 19/00* (2011.01)
*G06T 19/20* (2011.01)
*G06V 20/20* (2022.01)

(52) U.S. Cl.
CPC .......... *G06F 30/13* (2020.01); *G06T 7/50* (2017.01); *G06T 19/20* (2013.01); *G06T 7/70* (2017.01); *G06T 19/006* (2013.01); *G06T 2207/10016* (2013.01); *G06T 2207/10028* (2013.01); *G06V 20/20* (2022.01)

(58) Field of Classification Search
None
See application file for complete search history.

(56) References Cited

U.S. PATENT DOCUMENTS

| | | | |
|---|---|---|---|
| 7,852,461 B2* | 12/2010 | Yahav | G01S 17/48 356/3.01 |
| 8,705,893 B1 | 4/2014 | Zhang et al. | |
| 8,988,426 B2* | 3/2015 | Chen | G06T 19/00 345/419 |
| 9,336,602 B1* | 5/2016 | Chang | G06T 17/00 |
| 10,304,191 B1* | 5/2019 | Mousavian | G06T 7/50 |
| 10,373,380 B2* | 8/2019 | Kutliroff | G06T 19/006 |
| 10,395,435 B2* | 8/2019 | Powers | G06Q 30/0643 |
| 10,740,920 B1* | 8/2020 | Ebrahimi Afrouzi | G06T 17/05 |
| 11,238,666 B2* | 2/2022 | Jones | G06F 3/011 |
| 11,252,329 B1* | 2/2022 | Cier | G06T 7/50 |
| 11,405,558 B2* | 8/2022 | Dawson | H04N 23/695 |
| 11,562,529 B2* | 1/2023 | Daly | G06F 3/014 |

(Continued)

OTHER PUBLICATIONS

Hakanoglu, Orli, "RoomScan: Create a 3D Floorplan in Seconds Just by Walking Around the Room"; Mar. 24, 2012; pp. 1-6.

(Continued)

*Primary Examiner* — Akash Saxena
(74) *Attorney, Agent, or Firm* — Thompson Hine LLP

(57) ABSTRACT

Various implementations disclosed herein include devices, systems, and methods that determines two-dimensional (2D) floorplans based on image data and refines the 2D floorplans using various user interface controls. For example, an example process may include obtaining a floorplan that is generated based on a sequence of images of a physical environment, identify a type of an object depicted in the floorplan, identify a context of the object depicted in the floorplan, and modify the floorplan based on the type and the context of the object.

20 Claims, 9 Drawing Sheets

(56) References Cited

U.S. PATENT DOCUMENTS

| | | | | |
|---|---|---|---|---|
| 11,620,039 B2* | 4/2023 | Presley | ............... | G06F 30/12 |
| | | | | 715/768 |
| 11,721,074 B2* | 8/2023 | Luo | ............... | G06F 3/012 |
| | | | | 345/633 |
| 11,928,399 B1* | 3/2024 | Dolan | ............... | G06F 30/15 |
| 12,094,072 B2* | 9/2024 | Chapman | ............... | G06T 15/20 |
| 2013/0004060 A1* | 1/2013 | Bell | ............... | G06T 19/20 |
| | | | | 382/154 |
| 2014/0043436 A1* | 2/2014 | Bell | ............... | G06T 19/20 |
| | | | | 348/46 |
| 2014/0125658 A1* | 5/2014 | Bell | ............... | G06T 19/20 |
| | | | | 345/419 |
| 2015/0062117 A1* | 3/2015 | Reitmayr | ............... | G06T 15/00 |
| | | | | 345/419 |
| 2015/0325040 A1* | 11/2015 | Stirbu | ............... | G06T 15/40 |
| | | | | 345/421 |
| 2016/0005238 A1* | 1/2016 | Bailiang | ............... | G06T 17/05 |
| | | | | 345/419 |
| 2016/0189419 A1* | 6/2016 | Fakih | ............... | G06T 7/55 |
| | | | | 345/419 |
| 2016/0358382 A1* | 12/2016 | Lee | ............... | G06F 3/011 |
| 2018/0054562 A1* | 2/2018 | Li | ............... | G06T 7/50 |
| 2018/0067187 A1* | 3/2018 | Oh | ............... | G01S 1/024 |
| 2018/0253857 A1* | 9/2018 | Driegen | ............... | G06T 7/85 |
| 2019/0026958 A1* | 1/2019 | Gausebeck | ............... | G06T 7/593 |
| 2019/0035099 A1* | 1/2019 | Ebrahimi Afrouzi | ... | G06T 7/344 |
| 2019/0130637 A1* | 5/2019 | Parmar | ............... | G06T 7/70 |
| 2019/0228588 A1* | 7/2019 | Rockel | ............... | G06F 1/1686 |
| 2019/0311525 A1* | 10/2019 | Forsblom | ............... | G06T 19/20 |
| 2019/0392630 A1* | 12/2019 | Sturm | ............... | G06T 17/00 |
| 2020/0349351 A1* | 11/2020 | Brook | ............... | G06T 19/20 |
| 2021/0201575 A1* | 7/2021 | Arora | ............... | G06T 7/55 |
| 2021/0225043 A1* | 7/2021 | Tang | ............... | G06T 7/50 |
| 2021/0225081 A1* | 7/2021 | Tang | ............... | G06V 20/36 |
| 2021/0225090 A1* | 7/2021 | Tang | ............... | G06F 18/21 |
| 2021/0241495 A1* | 8/2021 | Cappello | ............... | G06T 7/50 |
| 2022/0101555 A1* | 3/2022 | Zhang | ............... | G06T 7/11 |
| 2023/0075601 A1* | 3/2023 | Tang | ............... | G06F 18/2148 |
| 2023/0336865 A1* | 10/2023 | Da Veiga | ............... | G06F 3/048 |
| 2024/0180634 A1* | 6/2024 | Mikus | ............... | A61B 90/50 |

OTHER PUBLICATIONS

Sensopia Inc.; "Magicplan—2D/3D Floor Plans on the App Store"; Feb. 5, 2013; pp. 1-2.

Smart Picture Technologies, Inc.; "PLNAR on the App Store"; Sep. 19, 2017; pp. 1-4.

* cited by examiner

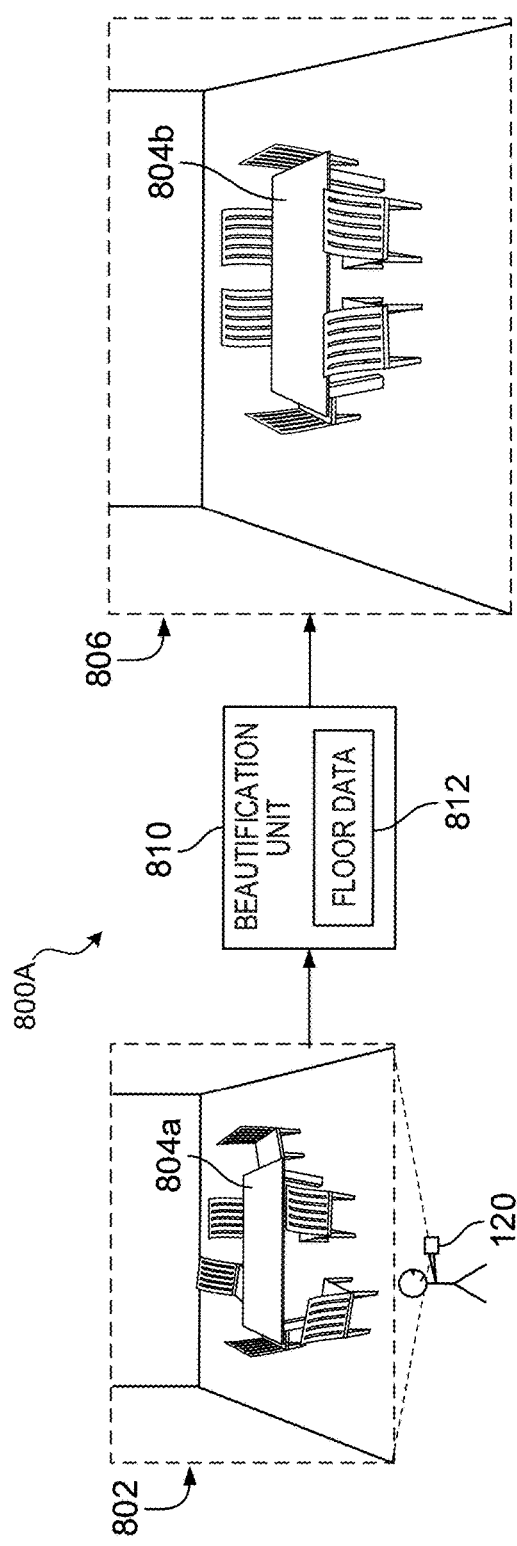
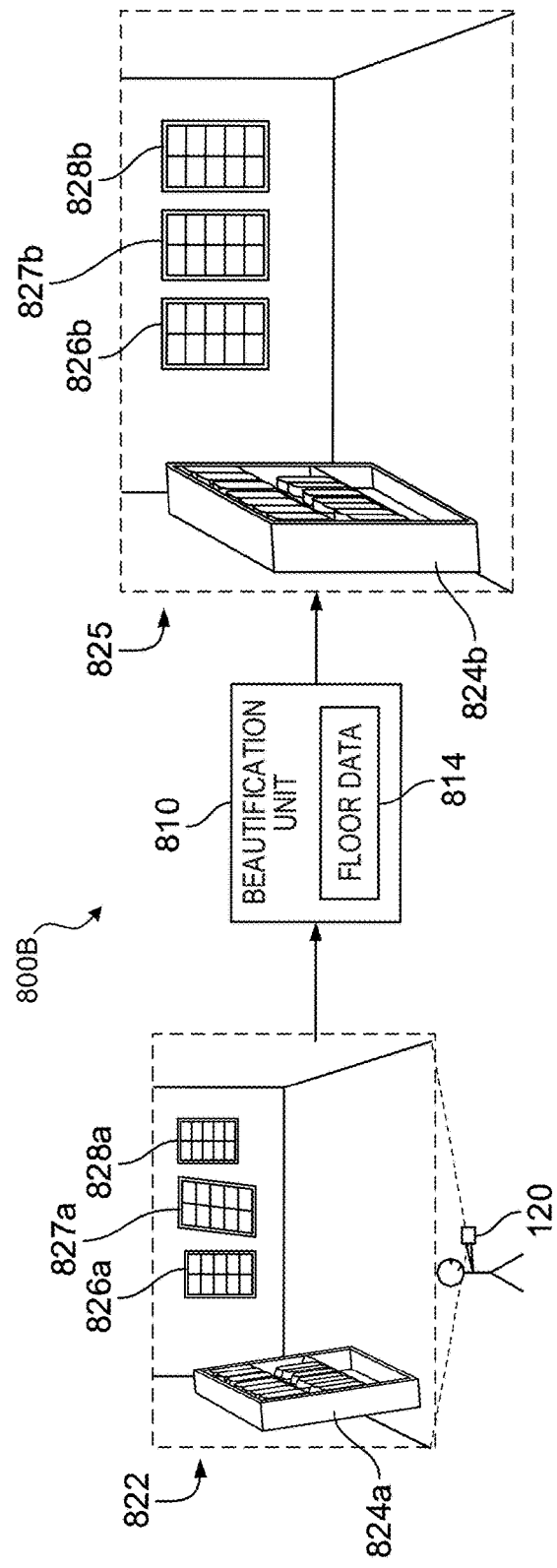
FIG. 8A
FIG. 8B

2D FLOORPLAN PIPELINE AND REFINEMENT

CROSS-REFERENCE TO RELATED APPLICATIONS

This application claims the benefit of U.S. Provisional Application Ser. No. 63/014,971 filed Apr. 24, 2020, which is incorporated herein in its entirety.

TECHNICAL FIELD

The present disclosure generally relates to generating geometric representations of physical environments, and in particular, to systems, methods, and devices that generate two-dimensional geometric representations based on information detected in physical environments.

BACKGROUND

Floorplans play an important role in designing, understanding, and remodeling indoor spaces. Floorplans are generally effective in conveying geometric and semantic information of a physical environment. For instance, a user may view a floorplan to quickly identify room extents, wall structures and corners, the locations of doors and windows, and object arrangements.

There are numerous hurdles to providing computer-based systems to automatically generate floorplans, room measurements, or object measurements based on sensor data. The sensor data obtained regarding a physical environment (e.g., images and depth data) may be incomplete or insufficient to provide accurate floorplans and measurements. For example, indoor environments often contain an assortment of objects, such as lamps, desks, chairs, etc., that may hide the architectural lines of the room that might otherwise be used to detect edges of a room to build an accurate floorplan. As another example, images and depth data typically lack semantic information and floorplans and measurements generated without such data may lack accuracy.

Existing techniques may not allow for automatic, accurate, and efficient generation of floorplans and measurements using a mobile device, for example, based on a user capturing photos or video or other sensor data while walking about in a room. Moreover, existing techniques may fail to provide sufficiently accurate and efficient floorplans and measurements in real time (e.g., immediate floorplan/measurement during scanning) environments.

SUMMARY

Various implementations disclosed herein include devices, systems, and methods that determine and refine two-dimensional (2D) floorplans of a physical environment based on obtained image data. Additionally, various implementations disclosed herein include devices, systems, and methods that provide user interfaces that facilitate the acquisition of the image data as well as facilitate the ability to refine the floorplans to improve accuracy. The floorplans may be generated based on sensor data, such as image and depth sensor data. The generation of floorplans is facilitated in some implementations using semantically-labeled three-dimensional (3D) representations of a physical environment. A floorplan may be provided in various formats. In some implementations, a floorplan includes a 2D top-down view of a room. A floorplan may graphically depict a boundary of a room, e.g., by graphically depicting walls, barriers, or other limitations of the extent of a room, using lines or other graphical features. A floorplan may graphically depict the locations and geometries of wall features such as wall edges, doors, and windows. A floorplan may graphically depict objects within a room, such as couches, tables, chairs, appliances, etc. A floorplan may include identifiers that identify the boundaries, walls, doors, windows, and objects in a room, e.g., including text labels or reference numerals that identify such elements. A floorplan may also include indications of measurements of boundaries, wall edges, doors, windows, and objects in a room, e.g., including numbers designating a length of a wall, a diameter of a table, a width of a window, etc.

According to some implementations, a floorplan is created based on a user performing a room scan with a user device that includes a user interface to provide feedback in a physical environment. In one example, a user performs a room scanning process by moving a mobile device to capture images and depth data around the user in a room. Some implementations provide feedback during the room scanning process that identifies (e.g., paints) portions of the currently displayed view of the room based on certain capture conditions having been met. For example, certain capture conditions may include those portions having sufficient information for the room scan that could be used to generate a floorplan. The feedback may also encourage the user to scan other areas of the room for which additional scanning may be needed.

According to some implementations, a floorplan is modified based on context-based object revision rules (also referred to herein as beautification). Some implementations focus on modifying a floorplan by altering the objects in the floorplan based on their semantics and contexts. For example, a table may be aligned with one or more walls, or chairs may be better aligned with the table. Windows may be adjusted to match one another's size, shape, style. In some implementations, windows may be adjusted to conform to sizing standards in the particular geographic location/country/state in which the room is located.

According to some implementations, particular (e.g., identified) portions of a floorplan can be edited based on whether the processes described herein identify those particular portions as having potential uncertainty. For example, some implementations focus on a user interface that enables a user to resolve uncertainty and/or inaccuracies of a floorplan. The user interface enables a user to resolve instances where multiple characteristics are possible, e.g., 80% chance an object is a couch and 20% chance the object is a sofa. In some implementations, the user is provided a drop-down menu of a limited set of potential objects. In another example, a wall may be a single long wall or two walls and the user interface enables the user to identify which is correct via a simple input, e.g., a single tap. The user interface can identify and highlight for the user the objects or items in the floorplan that have been identified as having potential uncertainty and allow the user to resolve those potential uncertain objects/areas. The user interface can then provide the user-identified identification of the object/area in the floorplan to increase the accuracy of the floorplan.

Some implementations of this disclosure involve an exemplary method of providing a user interface that provides feedback to a user during a floorplan scanning process that identifies portions of the currently displayed view of the room based on certain capture conditions. The exemplary method initially involves, at an electronic device having a processor, obtaining a live camera feed including a sequence of images of a physical environment. For example, the user captures video while walking around the room to capture images of different parts of the room from multiple perspectives. The exemplary method further involves obtaining depth data of the physical environment via a depth sensor during the obtaining of the live camera feed. For example, a depth sensor may provide a grid of approximately 500 depth points.

The exemplary method further involves determining a first portion and a second portion of the physical environment based on determining that the first portion satisfies a condition and the second portion does not satisfy the condition, the condition corresponding to generating a floorplan. For example, the condition can be based on the amount of depth data available for a given portion (e.g., at least a threshold number of data values per area). Additionally, or alternatively, the condition can be based on the angle of incidence associated with the depth data (e.g., less than 45 degrees). Additionally, or alternatively, the condition can be based on the distance of the device when it obtained the depth data (e.g., between 1-3 meters). Additionally, or alternatively, the condition can be based on identifying potentially occluded areas based on the depth data. In some implementations, such factors (e.g., an amount of depth data, an angle of incidence, a device distance, occlusion areas, and the like) may be used to determine a confidence score. For example, the system may determine that a particular area scanned may provide a 50% confidence score that a floorplan may be accurately generated from the image information obtained. In some implementations, a graphical indicator (e.g., a painting effect) may be provided for the second portion (e.g., low confidence score) if the confidence score is at or below a confidence threshold (e.g., 50%).

The exemplary method further involves displaying a user interface including the live camera feed with a graphical indicator (e.g., a painting effect) based on the first portion and the second portion. For example, a painting effect may distinguish the portions of the physical environment for which additional scanning is needed. The painting effect can include animation over time that encourages the user to move the device to scan in a particular direction. For example, the painting effect could have a different shading that expands upward that may encourage the user to scan upward. Additionally, or alternatively, the user interface could display user interface element (e.g., an extended reality image, such as a 3D arrow overlaid on a live video stream) to indicate to scan upwards. The user interface element can indicate areas in the physical environment that may require additional scanning.

In some implementations, determining that the first portion satisfies the condition is based on determining that an amount of depth data available for the first portion is greater than a threshold. For example, determining that at least a number of data values per area (e.g., 400 data values) is greater than a threshold (e.g., 500 data values). In some implementations, determining that the first portion satisfies the condition is based on determining that an angle of incidence associated with the depth data is less than a threshold. For example, determining that a determined angle of incidence (e.g., 30 degrees) is less than a threshold (e.g., less than 45 degrees). In some implementations, determining that the first portion satisfies the condition is based on an acquisition distance between the device and the first portion when the depth sensor obtained the depth data. For example, determining that the distance of the device during acquisition for a particular area is within a particular range (e.g., between 1-3 meters).

In some implementations, determining that the second portion does not satisfy the condition is based on identifying an area of occlusion based on the depth data. In some implementations, determining that the first portion satisfies the condition and the second portion does not satisfy the condition includes determining confidence scores associated with the first portion and second portion. For example, the system may determine that a particular area scanned may provide a 50% confidence score that a floorplan may be accurately generated from the image information obtained. In some implementations, a graphical indicator (e.g., a painting effect) may be provided for the second portion (e.g., low confidence score) if the confidence score is at or below a confidence threshold (e.g., 50%).

In some implementations, the graphical indicator includes a painting effect that distinguishes the first portion from the second portion of the physical environment. In some implementations, the graphical indicator indicates areas of the physical environment for additional scanning. For example, different shading effects can be used to signify a first portion that was scanned that includes enough image information, and a different shading effect (e.g., different color, different hue, different pattern effect) can be used to signify a second portion that was scanned that does not include enough image information during the scan such that the user needs to acquire additional information for that area (e.g., the second portion). In some implementations, the graphical indicator includes a time-based effect in a direction corresponding to areas of the physical environment for additional scanning. In some implementations, the graphical indicator includes a user interface element (e.g., an extended reality image, such as a 3D arrow overlaid on a live video stream) to indicate to scan upwards or another direction. The user interface element can indicate areas in the physical environment that may require additional scanning.

Some implementations of this disclosure involve an exemplary method of updating a floorplan by altering the objects in the floorplan based on their semantics and contexts (e.g., beautification). The exemplary method initially involves, at an electronic device having a processor, obtaining a floorplan, the floorplan generated based on a sequence of images of a physical environment. For example, the images can include of different parts of a room from multiple perspectives. In some implementations, the sequence of images of the physical environment includes depth data.

The exemplary method further involves identifying a type of an object depicted in the floorplan. For example, using semantic labels to identify a table, chair, window, etc.

The exemplary method further involves identifying a context of the object depicted in the floorplan. For example, the table is near a wall or walls, the chair is associated with a table, or there are multiple of a same type of items within a threshold distance of one another (e.g., chairs, windows, etc.).

In exemplary method further involves modifying the floorplan based on the type and the context of the object. For example, the modifications can include aligning the table with the wall, aligning the four chairs around the table, sizing the windows to match, moving a measurement value, etc.

In some implementations, the sequence of images of the physical environment includes depth data. In some implementations, identifying the type of the object depicted in the floorplan is based on semantic data. For example, segmentation data (e.g., semantic segmentation data such as RGB-S data) may be obtained from a segmentation unit that uses a machine learning model that is configured to identify semantic labels for pixels or voxels of image data.

In some implementations, identifying the context of the object includes identifying a plurality of walls in the floorplan, and determining that the object is closer to a first wall than other identified walls of the plurality of walls. In some implementations, modifying the floorplan includes aligning the object with the first wall. For example, the beautification process may include aligning a table that is near a particular wall. Aligning a table may include centering the table based on the distance of the wall from a corner to a door on the wall, or centering the table with respect to the wall from a corner to an opposite corner distance on the wall. Additionally, or alternatively, aligning a table with a wall may include aligning a square or rectangular table such that it is parallel with the wall to make sure the floorplan doesn't include misaligned (e.g., crooked) furniture where possible. An oval table may be aligned based on the aligning the length (e.g., the longest straight-line distance of an oval) to be parallel with a wall. A circular table may be aligned based on having the center point at an equidistance from two adjacent walls.

In some implementations, the object is a first object, and identifying the context of the first object includes determining that the first object is associated with a second object based on the identified type of the first object and an identified type of the second object depicted in the floorplan, wherein the identified type of the first object is different than the identified type of the second object. In some implementations, modifying the floorplan includes aligning the first object with the second object.

In some implementations, the object is a first object, and identifying the context of the first object includes determining that the first object is associated with a second object based on the identified type of the first object and an identified type of the second object depicted in the floorplan, wherein the identified type of the first object is the same as the identified type of the second object. For example, the beautification process can include identifying of multiple objects of a same type of items within a threshold distance of one another (e.g., chairs, windows, etc.) and aligning them based on certain context-based rules. In some implementations, modifying the floorplan includes aligning the first object based on an alignment of the second object. For example, aligning a chair with an associated table. In some implementations, modifying the floorplan includes resizing the first object to match a size of the second object. For example, resizing a window to match an adjacent window.

In some implementations, the floorplan includes a measurement value associated with the object, wherein modifying the floorplan includes modifying the measurement value to align with the object or an identified wall. For example, the floorplan generation system can include measurements of objects and room features (e.g., furniture, doors, windows, etc.) placed around the objects and room features. The beautification process can modify the placement of those measurement values so that they align with the objects to make them more aesthetically pleasing to the user. Modifying the measurement values may include reducing the text size to fit better, aligning the text with the object to make them parallel with the object or adjacent walls, removing the values until the user clicks on a room feature or object that they desire to show the measurement values, and the like.

Some implementations of this disclosure involve an exemplary method of editing particular (e.g., identified) portions of a floorplan based on whether those particular portions as having potential uncertainty. The exemplary method initially involves, at an electronic device having a processor, obtaining a floorplan of a physical environment. For example, the floorplan may be generated based on light intensity image data (e.g., RGB data) and depth data (e.g., from a depth sensor or extrapolated from the light intensity image data) of different parts of a room from multiple perspectives.

The exemplary method further involves displaying the floorplan with an indication corresponding to a portion of the floorplan in accordance with a determination to receive input selecting amongst options for the portion, the determination based on a characteristic of the portion. For example, the indication may identify that a user may provide input to confirm an option or select an alternative option. In some implementations, the indication may identify a primary option and an alternative option using distinguishing characteristics, e.g., a dotted line. Additionally, or alternatively, the indication may enable access to a drop-down list of couch, table, lounge chair, etc. for selection for an object.

The exemplary method further involves receiving input selecting amongst the options for the portion of the floorplan. For example, the input may confirm a primary option, select an alternative option, or select from a dropdown menu of possible options.

The exemplary method further involves depicting the portion of the floorplan in accordance with the input. For example, the floorplan may remain the same if the user confirms a primary option, or the floorplan can be modified if the user selects an alternative option, such as changing the indication of a couch to a chair.

In some implementations, the floorplan is generated based on depth data. In some implementations, determining to receive the input is based on an amount of information available for the portion. In some implementations, determining to receive the input is based on a size of an element depicted in the portion. For example, a large wall may be modeled as multiple walls due to inherent drift in data over time. In some implementations, determining to receive the input is based on a confidence value of an element depicted in the portion.

In some implementations, the method includes determining to receive input selecting amongst options for a portion of floorplan based on a characteristic of the portion. For example, the characteristics may be based on lack of information about the portion, such as not enough image information was obtained during a scanning process. Additionally, or alternatively, the characteristics may be based on not having enough information about an object or wall that is assumed to be in the portion. Additionally, or alternatively, the characteristics may be based on inherent flaws in the system. For example, a large wall may be modeled as multiple walls due to inherent drift in data over time.

In some implementations, the method includes determining the options for the portion of floorplan. For example, options for the portion of the floorplan could include the portion has no wall versus the portion has a wall, the portion has a single wall versus the portion has two walls, an object is table, a couch, a chair, etc., or the portion is a door that opens on its left edge versus but the door should open on its right edge.

In some implementations, a first option of the options includes a wall in the portion of the floorplan and the second option of the options excludes the wall from the portion of the floorplan. In some implementations, a first option of the options includes a first type of object in the portion and the second option of the options includes a second type of object in the portion. In some implementations, a first option of the options includes a door oriented in a first direction in the portion and the second option of the options includes the door oriented in a second, different direction in the portion. In some implementations, the indication provides a selectable list of the options.

In accordance with some implementations, a device includes one or more processors, a non-transitory memory, and one or more programs; the one or more programs are stored in the non-transitory memory and configured to be executed by the one or more processors and the one or more programs include instructions for performing or causing performance of any of the methods described herein. In accordance with some implementations, a non-transitory computer readable storage medium has stored therein instructions, which, when executed by one or more processors of a device, cause the device to perform or cause performance of any of the methods described herein. In accordance with some implementations, a device includes: one or more processors, a non-transitory memory, and means for performing or causing performance of any of the methods described herein.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

FIGS. 8A-B are block diagrams illustrating an example system flow of modifying a floorplan based on a type and a context of an identified object in a physical environment in accordance with some implementations.

Figure 1:
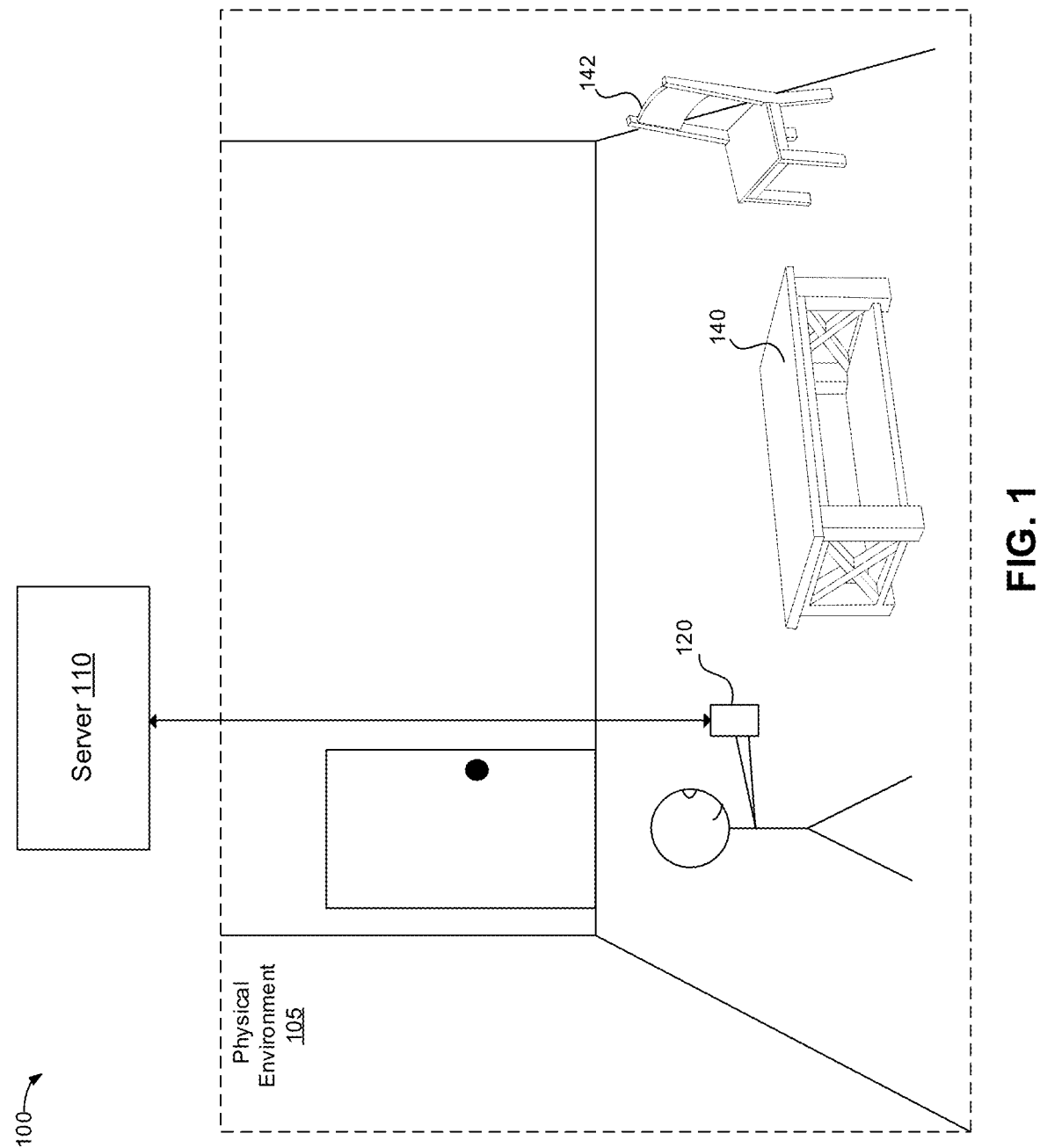
FIG. 1 is a block diagram of an example operating environment in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION

Numerous details are described in order to provide a thorough understanding of the example implementations shown in the drawings. However, the drawings merely show some example aspects of the present disclosure and are therefore not to be considered limiting. Those of ordinary skill in the art will appreciate that other effective aspects and/or variants do not include all of the specific details described herein. Moreover, well-known systems, methods, components, devices and circuits have not been described in exhaustive detail so as not to obscure more pertinent aspects of the example implementations described herein.

FIG. 1 is a block diagram of an example operating environment 100 in accordance with some implementations. In this example, the example operating environment 100 illustrates an example physical environment 105 that includes a table 142 and a chair 142. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the operating environment 100 includes a server 110 and a device 120. In an exemplary implementation, the operating environment 100 does not include a server 110, and the methods described herein are performed on the device 120.

In some implementations, the server 110 is configured to manage and coordinate an experience for the user. In some implementations, the server 110 includes a suitable combination of software, firmware, and/or hardware. The server 110 is described in greater detail below with respect to FIG. 2. In some implementations, the server 110 is a computing device that is local or remote relative to the physical environment 105. In one example, the server 110 is a local server located within the physical environment 105. In another example, the server 110 is a remote server located outside of the physical environment 105 (e.g., a cloud server, central server, etc.). In some implementations, the server 110 is communicatively coupled with the device 120 via one or more wired or wireless communication channels (e.g., BLUETOOTH, IEEE 802.11x, IEEE 802.16x, IEEE 802.3x, etc.).

In some implementations, the device 120 is configured to present an environment to the user. In some implementations, the device 120 includes a suitable combination of software, firmware, and/or hardware. The device 120 is described in greater detail below with respect to FIG. 3. In some implementations, the functionalities of the server 110 are provided by and/or combined with the device 120.

In some implementations, the device 120 is a handheld electronic device (e.g., a smartphone or a tablet) configured to present content to the user. In some implementations, the user 102 wears the device 120 on his/her head. As such, the device 120 may include one or more displays provided to display content. For example, the device 120 may enclose the field-of-view of the user 102. In some implementations, the device 120 is replaced with a chamber, enclosure, or room configured to present content in which the user 102 does not wear or hold the device 120.

Figure 2:
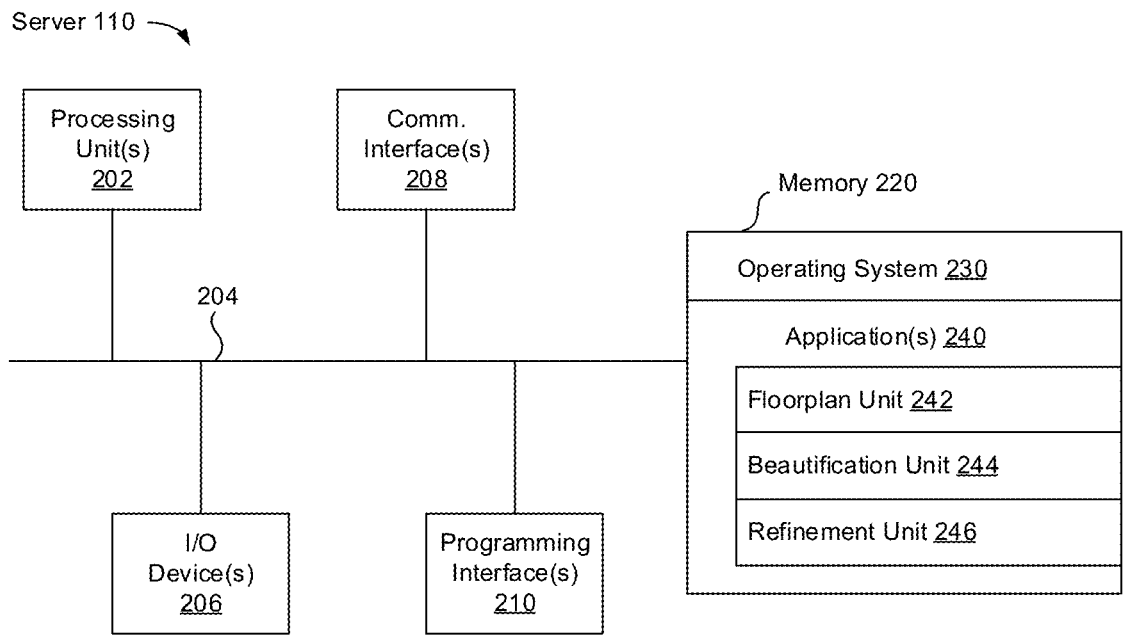
FIG. 2 is a block diagram of an example server in accordance with some implementations.

FIG. 2 is a block diagram of an example of the server 110 in accordance with some implementations. While certain specific features are illustrated, those skilled in the art will appreciate from the present disclosure that various other features have not been illustrated for the sake of brevity, and so as not to obscure more pertinent aspects of the implementations disclosed herein. To that end, as a non-limiting example, in some implementations the server 110 includes one or more processing units 202 (e.g., microprocessors, application-specific integrated-circuits (ASICs), field-programmable gate arrays (FPGAs), graphics processing units (GPUs), central processing units (CPUs), processing cores, and/or the like), one or more input/output (I/O) devices 206, one or more communication interfaces 208 (e.g., universal al serial bus (USB), FIREWIRE, THUNDERBOLT, IEEE 802.3x, IEEE 802.11x, IEEE 802.16x, global system for mobile communications (GSM), code division multiple access (CDMA), time division multiple access (TDMA), global positioning system (GPS), infrared (IR), BLUETOOTH, ZIGBEE, and/or the like type interface), one or more programming (e.g., I/O) interfaces 210, a memory 220, and one or more communication buses 204 for interconnecting these and various other components.

In some implementations, the one or more communication buses 204 include circuitry that interconnects and controls communications between system components. In some implementations, the one or more I/O devices 206 include at least one of a keyboard, a mouse, a touchpad, a joystick, one or more microphones, one or more speakers, one or more image sensors, one or more displays, and/or the like.

The memory 220 includes high-speed random-access memory, such as dynamic random-access memory (DRAM), static random-access memory (SRAM), double-data-rate random-access memory (DDR RAM), or other random-access solid-state memory devices. In some implementations, the memory 220 includes non-volatile memory, such as one or more magnetic disk storage devices, optical disk storage devices, flash memory devices, or other non-volatile solid-state storage devices. The memory 220 optionally includes one or more storage devices remotely located from the one or more processing units 202. The memory 220 includes a non-transitory computer readable storage medium. In some implementations, the memory 220 or the non-transitory computer readable storage medium of the memory 220 stores the following programs, modules and data structures, or a subset thereof including an optional operating system 230 and one or more applications 240.

The operating system 230 includes procedures for handling various basic system services and for performing hardware dependent tasks. In some implementations, the applications 240 are configured to manage and coordinate one or more experiences for one or more users (e.g., a single experience for one or more users, or multiple experiences for respective groups of one or more users).

The applications 240 include a floorplan unit 242, a beautification unit 244, and a refinement unit 246. The floorplan unit 242, the beautification unit 244, and the refinement unit 246 can be combined into a single application or unit or separated into one or more additional applications or units.

The floorplan unit 242 is configured with instructions executable by a processor to acquire image data (e.g., light intensity data, depth data, camera position information, etc.) and generate and display a 2D floorplan of a physical environment using one or more techniques disclosed herein. For example, the floorplan unit 242 acquires light intensity data (e.g., RGB data) from the light intensity camera and depth data from the depth camera, and generates a 2D floorplan that can be later updated and refined (e.g., provided to the beautification unit 244 and refinement unit 246). In some implementations, the floorplan unit 242 includes a scanning user interface unit that provides feedback to a user during a floorplan scanning process that identifies portions of the currently displayed view of the room based on certain capture conditions. In some implementations, the floorplan unit 242 includes a preliminary floorplan unit that iteratively updates preliminary floorplan data during room scanning to identify portions of the room that capture sufficient data to generate a 2D floorplan based on certain capture conditions and sends the preliminary data to the scanning user interface unit. In some implementations, the floorplan unit 242 includes a floorplan generation unit that generates a 2D floorplan of the physical environment based on the captured data. The floorplan can include semantic labels to identify all features and objects detected during the scan that are desired for a floorplan (e.g., doors, windows, walls, furniture, etc.). In some implementations the floorplan unit 242 acquires semantic segmentation data (e.g., semantic 3D point cloud) from a segmentation unit. Alternatively, the floorplan unit 242 includes a segmentation unit to generate the semantic segmentation data.

The beautification unit 244 is configured with instructions executable by a processor to acquire a floorplan from the floorplan unit 242 and modify the floorplan based on context-based object revision rules (also referred to herein as beautification), using one or more of the techniques disclosed herein. Some implementations focus on refining a floorplan by altering the objects in the floorplan based on their semantics and contexts. For example, a table may be aligned with one or more walls, or chairs may be better aligned with the table. Windows may be adjusted to match one another's size, shape, style. In some implementations, windows may be adjusted to conform to sizing standards in the particular geographic location/country/state in which the room is located.

The refinement unit 246 is configured with instructions executable by a processor to acquire the modified floorplan from the beautification unit 244 and generate a refined floorplan by providing a user interface that allows a user to edit particular portions that have potential uncertainty which have been identified using one or more techniques disclosed herein. For example, the refinement unit 246 can include an editing user interface unit interface that enables a user to resolve uncertainty and/or inaccuracies of a floorplan. The user interface enables a user to resolve instances where multiple characteristics are possible, e.g., 80% chance an object is a couch and 20% chance the object is a sofa. In some implementations, the user is provided a drop-down menu of a limited set of potential objects. In another example, a wall may be a single long wall or two walls and the user interface enables the user to identify which is correct via a simple input, e.g., a single tap. The user interface can identify and highlight or project to the user the objects or items in the floorplan that the system allows the user to provide the user-identified identification of the object in the floorplan to increase the accuracy of the floorplan. After the user has selected the correct identifications for the identified areas of uncertainty using the editing user interface, the refinement unit 246 generates a refined 2D floorplan.

Although these elements are shown as residing on a single device (e.g., the server 110), it should be understood that in other implementations, any combination of the elements may be located in separate computing devices. Moreover, FIG. 2 is intended more as functional description of the various features which are present in a particular implementation as opposed to a structural schematic of the implementations described herein. As recognized by those of ordinary skill in the art, items shown separately could be combined and some items could be separated. For example, some functional modules shown separately in FIG. 2 could be implemented in a single module and the various functions of single functional blocks could be implemented by one or more functional blocks in various implementations. The actual number of modules and the division of particular functions and how features are allocated among them will vary from one implementation to another and, in some implementations, depends in part on the particular combination of hardware, software, and/or firmware chosen for a particular implementation.

Figure 3:
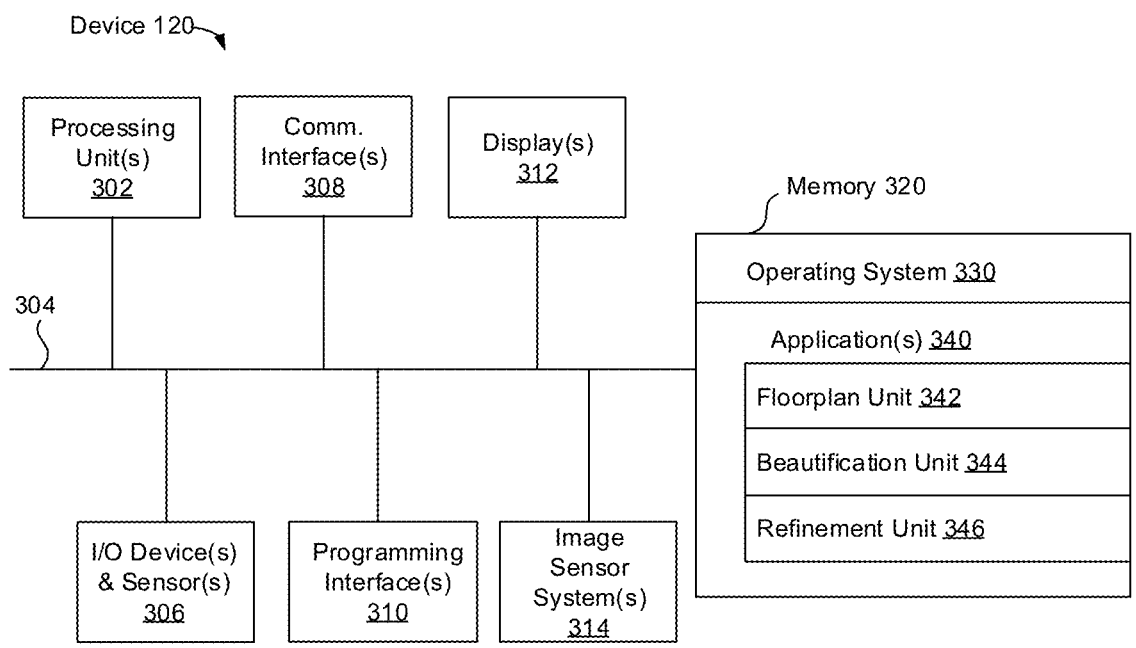
FIG. 3 is a block diagram of an example device in accordance with some implementations.

FIG. 3 is a block diagram of an example of the device 120 in accordance with some implementations. While certain specific features are illustrated, those skilled in the art will appreciate from the present disclosure that various other features have not been illustrated for the sake of brevity, and so as not to obscure more pertinent aspects of the implementations disclosed herein. To that end, as a non-limiting example, in some implementations the device 120 includes one or more processing units 302 (e.g., microprocessors, ASICs, FPGAs, GPUs, CPUs, processing cores, and/or the like), one or more input/output (I/O) devices and sensors 306, one or more communication interfaces 308 (e.g., USB, FIREWIRE, THUNDERBOLT, IEEE 802.3x, IEEE 802.11x, IEEE 802.16x, GSM, CDMA, TDMA, GPS, IR, BLUETOOTH, ZIGBEE, SPI, I2C, and/or the like type interface), one or more programming (e.g., I/O) interfaces 310, one or more AR/VR displays 312, one or more interior and/or exterior facing image sensor systems 314, a memory 320, and one or more communication buses 304 for interconnecting these and various other components.

In some implementations, the one or more communication buses 304 include circuitry that interconnects and controls communications between system components. In some implementations, the one or more I/O devices and sensors 306 include at least one of an inertial measurement unit (IMU), an accelerometer, a magnetometer, a gyroscope, a thermometer, one or more physiological sensors (e.g., blood pressure monitor, heart rate monitor, blood oxygen sensor, blood glucose sensor, etc.), one or more microphones, one or more speakers, a haptics engine, one or more depth sensors (e.g., a structured light, a time-of-flight, or the like), and/or the like.

In some implementations, the one or more displays 312 are configured to present the experience to the user. In some implementations, the one or more displays 312 correspond to holographic, digital light processing (DLP), liquid-crystal display (LCD), liquid-crystal on silicon (LCoS), organic light-emitting field-effect transitory (OLET), organic light-emitting diode (OLED), surface-conduction electron-emitter display (SED), field-emission display (FED), quantum-dot light-emitting diode (QD-LED), micro-electro-mechanical system (MEMS), and/or the like display types. In some implementations, the one or more displays 312 correspond to diffractive, reflective, polarized, holographic, etc. waveguide displays. For example, the device 120 includes a single display. In another example, the device 120 includes an display for each eye of the user.

In some implementations, the one or more image sensor systems 314 are configured to obtain image data that corresponds to at least a portion of the physical environment 105. For example, the one or more image sensor systems 314 include one or more RGB cameras (e.g., with a complimentary metal-oxide-semiconductor (CMOS) image sensor or a charge-coupled device (CCD) image sensor), monochrome cameras, IR cameras, event-based cameras, and/or the like. In various implementations, the one or more image sensor systems 314 further include illumination sources that emit light, such as a flash. In various implementations, the one or more image sensor systems 314 further include an on-camera image signal processor (ISP) configured to execute a plurality of processing operations on the image data including at least a portion of the processes and techniques described herein.

The memory 320 includes high-speed random-access memory, such as DRAM, SRAM, DDR RAM, or other random-access solid-state memory devices. In some implementations, the memory 320 includes non-volatile memory, such as one or more magnetic disk storage devices, optical disk storage devices, flash memory devices, or other non-volatile solid-state storage devices. The memory 320 optionally includes one or more storage devices remotely located from the one or more processing units 302. The memory 320 includes a non-transitory computer readable storage medium. In some implementations, the memory 320 or the non-transitory computer readable storage medium of the memory 320 stores the following programs, modules and data structures, or a subset thereof including an optional operating system 330 and one or more applications 340.

The operating system 330 includes procedures for handling various basic system services and for performing hardware dependent tasks. In some implementations, the applications 340 are configured to manage and coordinate one or more experiences for one or more users (e.g., a single experience for one or more users, or multiple experiences for respective groups of one or more users).

The applications 340 include a floorplan unit 342, a beautification unit 344, and a refinement unit 346. The floorplan unit 342, the beautification unit 344, and the refinement unit 346 can be combined into a single application or unit or separated into one or more additional applications or units.

The floorplan unit 342 is configured with instructions executable by a processor to acquire image data (e.g., light intensity data, depth data, camera position information, etc.) and generate and display a 2D floorplan of a physical environment using one or more techniques disclosed herein. For example, the floorplan unit 342 acquires light intensity data (e.g., RGB data) from the light intensity camera and depth data from the depth camera, and generates a 2D floorplan that can be later updated and refined (e.g., provided to the beautification unit 344 and refinement unit 346). In some implementations, the floorplan unit 342 includes a scanning user interface unit that provides feedback to a user during a floorplan scanning process that identifies portions of the currently displayed view of the room based on certain capture conditions. In some implementations, the floorplan unit 342 includes a preliminary floorplan unit that iteratively updates preliminary floorplan data during room scanning to identify portions of the room that capture sufficient data to generate a 2D floorplan based on certain capture conditions and sends the preliminary data to the scanning user interface unit. In some implementations, the floorplan unit 342 includes a floorplan generation unit that generates a 2D floorplan of the physical environment based on the captured data. The floorplan can include semantic labels to identify all features and objects detected during the scan that are desired for a floorplan (e.g., doors, windows, walls, furniture, etc.). In some implementations the floorplan unit 342 acquires semantic segmentation data (e.g., semantic 3D point cloud)

from a segmentation unit. Alternatively, the floorplan unit 342 includes a segmentation unit to generate the semantic segmentation data.

The beautification unit 344 is configured with instructions executable by a processor to acquire the floorplan from the floorplan unit 342 and modify the floorplan based on context-based object revision rules (also referred to herein as beautification), using one or more of the techniques disclosed herein. Some implementations focus on refining a floorplan by altering the objects in the floorplan based on their semantics and contexts. For example, a table may be aligned with one or more walls, or chairs may be better aligned with the table. Windows may be adjusted to match one another's size, shape, style. In some implementations, windows may be adjusted to conform to sizing standards in the particular geographic location/country/state in which the room is located.

The refinement unit 346 is configured with instructions executable by a processor to acquire the modified floorplan from the beautification unit 344 and generate a refined floorplan by providing a user interface that allows a user to edit particular portions that have potential uncertainty which have been identified using one or more techniques disclosed herein. For example, the refinement unit 346 can include an editing user interface unit interface that enables a user to resolve uncertainty and/or inaccuracies of a floorplan. The user interface enables a user to resolve instances where multiple characteristics are possible, e.g., 80% chance an object is a couch and 20% chance the object is a sofa. In some implementations, the user is provided a drop-down menu of a limited set of potential objects. In another example, a wall may be a single long wall or two walls and the user interface enables the user to identify which is correct via a simple input, e.g., a single tap. The user interface can identify and highlight or project to the user the objects or items in the floorplan that the system allows the user to provide the user-identified identification of the object in the floorplan to increase the accuracy of the floorplan. After the user has selected the correct identifications for the identified areas of uncertainty using the editing user interface, the refinement unit 346 generates a refined 2D floorplan.

Although these elements are shown as residing on a single device (e.g., the device 120), it should be understood that in other implementations, any combination of the elements may be located in separate computing devices. Moreover, FIG. 3 is intended more as functional description of the various features which are present in a particular implementation as opposed to a structural schematic of the implementations described herein. As recognized by those of ordinary skill in the art, items shown separately could be combined and some items could be separated. For example, some functional modules (e.g., applications 340) shown separately in FIG. 3 could be implemented in a single module and the various functions of single functional blocks could be implemented by one or more functional blocks in various implementations. The actual number of modules and the division of particular functions and how features are allocated among them will vary from one implementation to another and, in some implementations, depends in part on the particular combination of hardware, software, and/or firmware chosen for a particular implementation.

Figure 4:
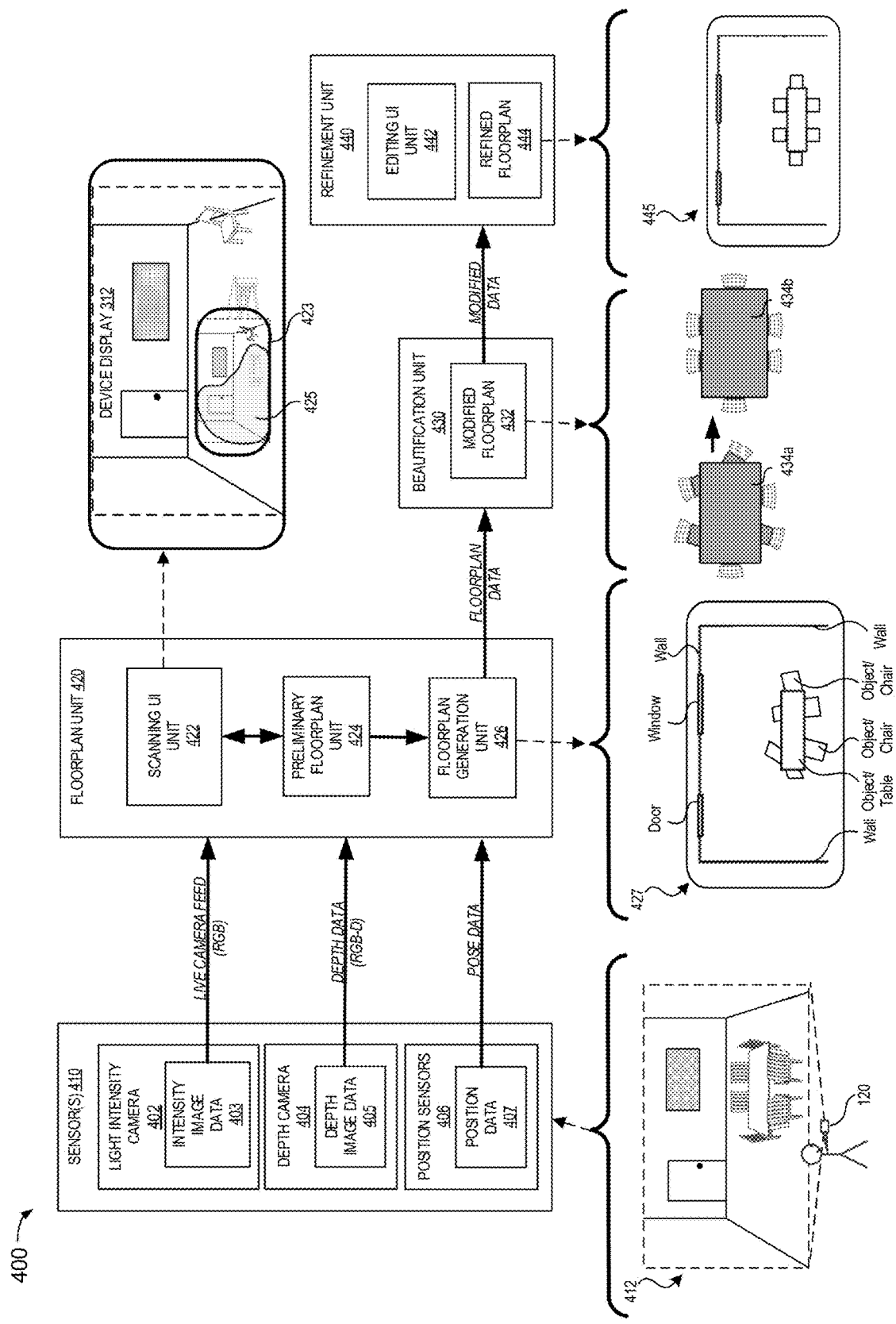
FIG. 4 is a system flow diagram illustrating an example generation of a 2D floorplan of a physical environment according to some implementations.

FIG. 4 is a system flow diagram of an example environment 400 in which a system can generate 2D floorplans based on image data and refines the 2D floorplans using various user interface controls according to some implementations. In some implementations, the system flow of the example environment 400 is performed on a device (e.g., server 110 or device 120 of FIGS. 1-3), such as a mobile device, desktop, laptop, or server device. The system flow of the example environment 400 can be displayed on a device (e.g., device 120 of FIGS. 1 and 3) that has a screen for displaying images and/or a screen for viewing stereoscopic images such as a head-mounted display (HMD). In some implementations, the system flow of the example environment 400 is performed on processing logic, including hardware, firmware, software, or a combination thereof. In some implementations, the system flow of the example environment 400 is performed on a processor executing code stored in a non-transitory computer-readable medium (e.g., a memory).

The system flow of the example environment 400 acquires from sensors (e.g., sensors 410) light intensity image data 403 (e.g., live camera feed such as RGB from light intensity camera 402), depth image data 405 (e.g., depth image data such as RGB-D from depth camera 404), and other sources of physical environment information (e.g., camera positioning information 407 such as position and orientation data, e.g., pose data, from position sensors 406) of a physical environment (e.g., the physical environment 105 of FIG. 1), assesses the image data and generates a 2D floorplan (e.g., the floorplan unit 420), modifies the floorplan based on context-based object revision rules (e.g., the beautification unit 430), and edits and refines the modified floorplan by providing a user interface that allows a user to edit particular portions that have been identified as including potential uncertainty (e.g., the refinement unit 440).

In an example implementation, the environment 400 includes an image composition pipeline that acquires or obtains data (e.g., image data from image source(s) such as sensors 410) for the physical environment. Example environment 400 is an example of acquiring image sensor data (e.g., light intensity data, depth data, and position information) for a plurality of image frames, such as acquiring image data from the example environment 412. The image source(s) may include a depth camera 404 that acquires depth data 405 of the physical environment, a light intensity camera 402 (e.g., RGB camera) that acquires light intensity image data 403 (e.g., a sequence of RGB image frames), and position sensors 406 to acquire positioning information. For the positioning information 407, some implementations include a visual inertial odometry (VIO) system to determine equivalent odometry information using sequential camera images (e.g., light intensity data 403) to estimate the distance traveled. Alternatively, some implementations of the present disclosure may include a SLAM system (e.g., position sensors 406). The SLAM system may include a multidimensional (e.g., 3D) laser scanning and range measuring system that is GPS-independent and that provides real-time simultaneous location and mapping. The SLAM system may generate and manage data for a very accurate point cloud that results from reflections of laser scanning from objects in an environment. Movements of any of the points in the point cloud are accurately tracked over time, so that the SLAM system can maintain precise understanding of its location and orientation as it travels through an environment, using the points in the point cloud as reference points for the location.

In an example implementation, the environment 400 includes a floorplan unit 420 that is configured with instructions executable by a processor to obtain sensor data (e.g., image data such as light intensity data, depth data, camera position information, etc.) and generate and display a 2D floorplan of a physical environment using one or more techniques disclosed herein. For example, the floorplan unit 420 (e.g., floorplan unit 242 of FIG. 2 and/or floorplan unit 342 of FIG. 3) acquires light intensity data 403 (e.g., RGB data) from the light intensity camera 402 and depth data 405 from the depth camera 404, and generates a 2D floorplan that can be later updated and refined (e.g., provided to the beautification unit 244 and refinement unit 246). In some implementations, the floorplan unit 420 includes a scanning user interface unit 422 that is configured with instructions executable by a processor to provide feedback 425 (e.g., painting effect) to a user via a picture-in-picture display 423 during a floorplan scanning process that identifies portions of the currently displayed view of the room based on certain capture conditions. This scanning user interface process for providing feedback to a user is further described herein with reference to FIGS. 5-6.

In some implementations, the floorplan unit 420 includes a preliminary floorplan unit 424 that is configured with instructions executable by a processor to iteratively update preliminary floorplan data during room scanning to identify portions of the room that capture sufficient data to generate a 2D floorplan based on certain capture conditions and sends the preliminary data to the scanning user interface unit. In some implementations, the floorplan unit 420 includes a floorplan generation unit 426 that is configured with instructions executable by a processor to generate a 2D floorplan 427 of the physical environment based on the captured data. In some implementations the floorplan 427 includes semantic labels for identified room features (e.g., doors, walls, windows, etc.) and identified objects (furniture, appliances, etc.). In some implementations the floorplan 427 includes measurement data for the identified room features and objects and/or measurements displayed on the floorplan image.

In an example implementation, the environment 400 further includes a beautification unit 430 (e.g., beautification unit 244 of FIG. 2 and/or beautification unit 344 of FIG. 3) that is configured with instructions executable by a processor to acquire the floorplan from the floorplan unit 420 (e.g., floorplan generation unit 426) and modify the floorplan based on context-based object revision rules (e.g., beautification), using one or more of the techniques disclosed herein. Some implementations focus on refining a floorplan by altering the objects in the floorplan based on their semantics and contexts. For example, a table may be aligned with one or more walls, or chairs may be better aligned with an associated table. For example, table/chairs 434a may include chairs that are not aligned (e.g., as shown in floorplan 427), but after beatification protocols described herein, the table/chairs 434b are updated as aligned as illustrated (e.g., as updated in floorplan 445). The beatification process is further described herein with reference to FIGS. 7-8.

In an example implementation, the environment 400 further includes a refinement unit 440 (e.g., refinement unit 246 of FIG. 2 and/or refinement unit 346 of FIG. 3) that is configured with instructions executable by a processor to acquire the modified floorplan from the beautification unit 430 and generate a refined floorplan by providing a user interface that allows a user to edit particular portions that have potential uncertainty which have been identified using one or more techniques disclosed herein. For example, the refinement unit 440 can include an editing user interface unit 442 that provides an interface that enables a user to resolve uncertainty and/or inaccuracies of a floorplan. The user interface can enable a user to resolve instances where multiple characteristics are possible, e.g., 80% chance an object is a couch and 20% chance the object is a sofa. In some implementations, the user is provided a drop-down menu of a limited set of potential objects. In another example, a wall may be a single long wall or two walls and the user interface enables the user to identify which is correct via a simple input, e.g., a single tap. The user interface can identify and highlight or project to the user the objects or items in the floorplan that the system allows the user to provide the user-identified identification of the object in the floorplan to increase the accuracy of the floorplan. After the user has selected the correct identifications for the identified areas of uncertainty using the editing user interface, the refinement unit 440 generates a refined floorplan data 444 that includes a refined/updated 2D floorplan 445. This refinement process is further described herein with reference to FIGS. 9-10.

In some implementations, the example environment 400 includes a 3D representation unit (e.g., within the floorplan unit 420 or downstream from the refinement unit 440) that is configured with instructions executable by a processor to obtain the sensor data (e.g., RGB data 403, depth data 405, etc.) and measurement data, and generate 3D representation data with measurements using one or more techniques. For example, the 3D representation unit analyzes RGB images from a light intensity camera 402 with a sparse depth map from a depth camera 404 (e.g., time-of-flight sensor) and other sources of physical environment information (e.g., camera positioning information such as position/motion data 407 from the sensors 406, or a camera's SLAM system, or the like) to generate 3D representation data (e.g., a 3D model representing the physical environment of FIG. 1). In some implementations, the 3D representation data could be 3D representations representing the surfaces in a 3D environment using a 3D point cloud with associated semantic labels. The 3D representations may be 3D bounding boxes for each detected object of interest, such as table 142, and chair 140. In some implementations, the 3D representation data is a 3D reconstruction mesh that is generated using a meshing algorithm based on depth information detected in the physical environment that is integrated (e.g., fused) to recreate the physical environment. A meshing algorithm (e.g., a dual marching cubes meshing algorithm, a poisson meshing algorithm, a tetrahedral meshing algorithm, or the like) can be used to generate a mesh representing a room (e.g., physical environment 105) and/or object(s) within a room (e.g., table 142, chair 140, etc.). In some implementations, for 3D reconstructions using a mesh, to efficiently reduce the amount of memory used in the reconstruction process, a voxel hashing approach is used in which 3D space is divided into voxel blocks, referenced by a hash table using their 3D positions as keys. The voxel blocks are only constructed around object surfaces, thus freeing up memory that would otherwise have been used to store empty space. The voxel hashing approach is also faster than competing approaches at that time, such as octree-based methods. In addition, it supports streaming of data between the GPU, where memory is often limited, and the CPU, where memory is more abundant.

In some implementations, the example environment 400 further includes an integration unit (e.g., within the floorplan unit 420) that is configured with instructions executable by a processor to obtain the subset of image data (e.g., light intensity data 403, depth data 405, etc.) and positioning information (e.g., camera pose information from the position/motion sensors 406) and integrate (e.g., fuse) the subset of image data using one or more known techniques. For example, the image integration unit receives a subset of depth image data 405 (e.g., sparse depth data) and a subset of intensity image data 403 (e.g., RGB) from the image sources (e.g., light intensity camera 402 and depth camera 404), and integrates the subset of image data and generates 3D data. The 3D data can include a dense 3D point cloud (e.g., imperfect depth maps and camera poses for a plurality of image frames around the object) that is sent to a 3D representation unit (e.g., a unit that generates 3D models of the image data). The 3D data can also be voxelized.

In some implementations, the example environment 400 further includes a semantic segmentation unit (e.g., within the floorplan unit 420) that is configured with instructions executable by a processor to obtain a subset the light intensity image data (e.g., light intensity data 403) and identify and segment wall structures (wall, doors, windows, etc.) and objects (e.g., person, table, teapot, chair, vase, etc.) using one or more known techniques. For example, the segmentation unit receives a subset of intensity image data 403 from the image sources (e.g., light intensity camera 402), and generates segmentation data (e.g., semantic segmentation data such as RGB-S data). In some implementations, a segmentation unit uses a machine learning model, where a semantic segmentation model may be configured to identify semantic labels for pixels or voxels of image data. In some implementations, the machine learning model is a neural network (e.g., an artificial neural network), decision tree, support vector machine, Bayesian network, or the like.

Figure 5:
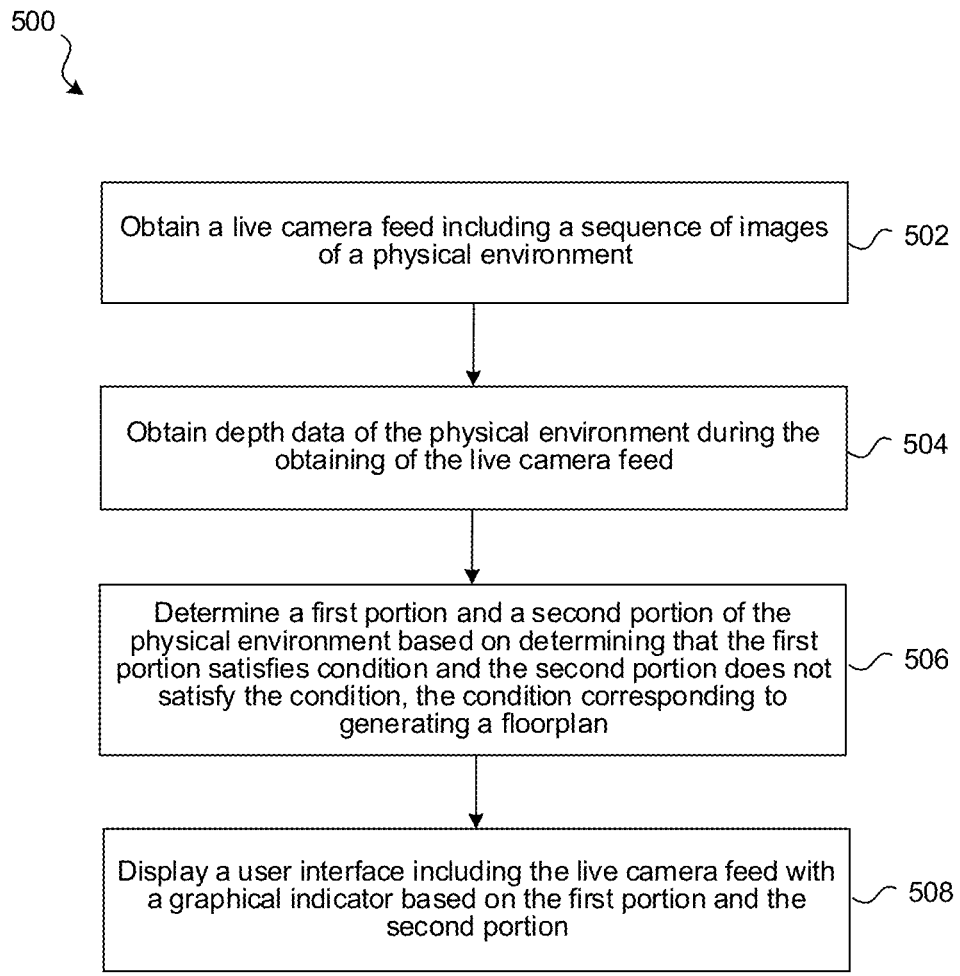
FIG. 5 is a flowchart representation of an exemplary method that provides feedback within a user interface during a floorplan scanning process in accordance with some implementations.

FIG. 5 is a flowchart representation of an exemplary method 500 that provides a user interface that provides feedback (e.g., a painting effect) to a user during a floorplan scanning process that identifies portions of the currently displayed view of the room based on certain capture conditions in accordance with some implementations. In some implementations, the method 500 is performed by a device (e.g., server 110 or device 120 of FIGS. 1-3), such as a mobile device, desktop, laptop, or server device. The method 500 can be performed on a device (e.g., device 120 of FIGS. 1 and 3) that has a screen for displaying images and/or a screen for viewing stereoscopic images such as a head-mounted display (HMD). In some implementations, the method 500 is performed by processing logic, including hardware, firmware, software, or a combination thereof. In some implementations, the method 500 is performed by a processor executing code stored in a non-transitory computer-readable medium (e.g., a memory). The process of providing a user interface that provides feedback (e.g., a painting effect) to a user during a floorplan scanning process of method 500 is illustrated with reference to FIG. 6.

At block 502, the method 500 obtains a live camera feed including a sequence of images of a physical environment. For example, the user captures video while walking around the room to capture images of different parts of the room from multiple perspectives. At block 504, the method 500 obtains depth data of the physical environment during the obtaining of the live camera feed. The depth data can include pixel depth values from a viewpoint and sensor position and orientation data. In some implementations, the depth data is obtained using one or more depth cameras. For example, the one or more depth cameras can acquire depth based on structured light (SL), passive stereo (PS), active stereo (AS), time-of-flight (ToF), and the like. Various techniques may be applied to acquire depth image data to assign each portion (e.g., at a pixel level) of the image. For example, voxel data (e.g., a raster graphic on a 3D grid, with the values of length, width, and depth) may also contain multiple scalar values such as opacity, color, and density. In some implementations, depth data is obtained from sensors or 3D models of the content of an image. Some or all of the content of an image can be based on a real environment, for example, depicting the physical environment 105 around the device 120. Image sensors may capture images of the physical environment 105 for inclusion in the image and depth information about the physical environment 105. In some implementations, a depth sensor on the device 120 determines depth values for voxels that are determined based on images captured by an image sensor on the device 120. For example, a depth sensor may provide a grid of approximately 500 depth points.

At block 506, the method 500 determines a first portion and a second portion of the physical environment based on determining that the first portion satisfies a condition and the second portion does not satisfy the condition, the condition corresponding to generating a floorplan. For example, the condition can be based on the amount of depth data available for a given portion (e.g., at least a threshold number of data values per area).

Additionally, or alternatively, in some implementations, the condition can be based on the angle of incidence associated with the device when it obtained the depth data relative to the portion(s) (e.g., less than 45 degrees). Additionally, or alternatively, the condition can be based on the distance of the device when it obtained the depth data relative to the portion(s) (e.g., between 1-3 meters). Additionally, or alternatively, the condition can be based on identifying potentially occluded areas based on the depth data.

In some implementations, such factors (e.g., an amount of depth data, an angle of incidence, a device distance, occlusion areas, and the like) may be used to determine a confidence score. For example, the system may determine that a particular area scanned may provide a 50% confidence score that a floorplan may be accurately generated from the image information obtained. In some implementations, a graphical indicator (e.g., a painting effect) may be provided for the second portion (e.g., low confidence score) if the confidence score is at or below a confidence threshold (e.g., 50%).

In some implementations, determining that the first portion satisfies the condition is based on determining that an amount of depth data available for the first portion is greater than a threshold. For example, determining that at least a number of data values per area (e.g., 500 data values) is greater than a threshold (e.g., 400 data values). In some implementations, determining that the first portion satisfies the condition is based on determining that an angle of incidence associated with the depth data is less than a threshold. For example, determining that a determined angle of incidence (e.g., 30 degrees) is less than a threshold (e.g., less than 45 degrees). In some implementations, determining that the first portion satisfies the condition is based on an acquisition distance between the device and the first portion when the depth sensor obtained the depth data. For example, determining that the distance of the device during acquisition for a particular area is within a particular range (e.g., between 1-3 meters).

In some implementations, determining that the second portion does not satisfy the condition is based on identifying an area of occlusion based on the depth data. In some implementations, determining that the first portion satisfies the condition and the second portion does not satisfy the condition includes determining confidence scores associated with the first portion and the second portion. For example, the system may determine that a particular area scanned may provide a 50% confidence score that a floorplan may be accurately generated from the image information obtained.

In some implementations, a graphical indicator (e.g., a painting effect) may be provided for the second portion (e.g., low confidence score) if the confidence score is at or below a confidence threshold (e.g., 50%). In some implementations, a graphical indicator (e.g., a painting effect) may be provided for the first portion (e.g., high confidence score) if the confidence score is above a confidence threshold (e.g., 50%).

At block 508, the method 500 displays a user interface including the live camera feed with a graphical indicator (e.g., a painting effect) based on the first portion and the second portion. For example, a painting effect may distinguish the portions of the physical environment for which additional scanning is needed. The painting effect can include animation over time that encourages the user to move the device to scan in a particular direction. For example, the painting effect could have a different shading that expands upward that may encourage the user to scan upward.

In some implementations, the graphical indicator includes a painting effect that distinguishes the first portion from the second portion of the physical environment. In some implementations, the graphical indicator indicates areas of the physical environment for additional scanning. For example, different shading effects can be used to signify a first portion that was scanned that includes enough image information, and a different shading effect (e.g., different color, different hue, different pattern effect) can be used to signify a second portion that was scanned that does not include enough image information during the scan such that the user needs to acquire additional information for that area (e.g., the second portion). In some implementations, the graphical indicator includes a time-based effect in a direction corresponding to areas of the physical environment for additional scanning.

Additionally, or alternatively, in some implementations, the user interface could display a user interface element (e.g., an extended reality image, such as a 3D arrow overlaid on a live video stream) to indicate to scan upwards. The user interface element can indicate areas in the physical environment that may require additional scanning.

In use, for the process 500, a user (e.g., user with device 120 in FIG. 1) may acquire images of a room with a device (e.g., a smartphone such as device 120) and the processes described herein would acquire sensor data (image data and positioning information), identify portions of the sensors data where a condition is met (e.g., sufficient data to generate a floorplan) and portions that do not satisfy the condition (e.g., not enough data to generate an accurate floorplan), and provide feedback via a user interface to the user that identifies each portion using a graphical indicator (e.g., a painting effect). Thus, as shown and discussed below with reference to FIG. 6, a scanning user interface unit 610 of a floorplan unit (e.g., floorplan unit 242 of FIG. 2, and/or floorplan unit 342 of FIG. 3) receives image data and provides a user interface that identifies portions of the room that have been scanned and provides feedback to the user the portions where enough image information has been acquired and areas that may require additional scanning.

Figure 6:
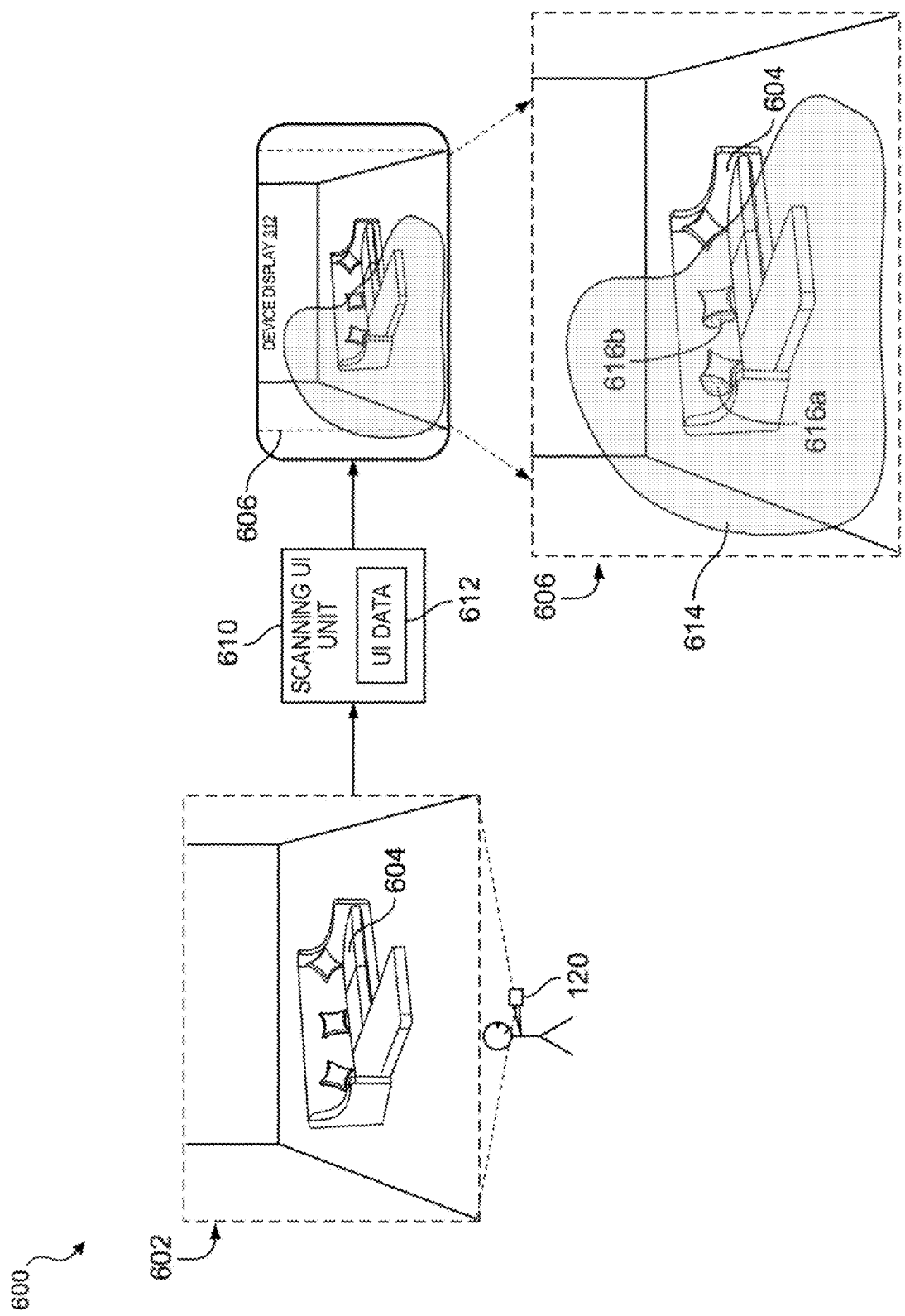
FIG. 6 is a block diagram illustrating an example system flow of providing feedback within a user interface during a floorplan scanning process in accordance with some implementations.

FIG. 6 is a block diagram illustrating a system flow of providing feedback within a user interface (e.g., graphical indicator) during a floorplan scanning process in accordance with some implementations. In particular, FIG. 6 illustrates an example environment 600 in which a scanning user interface unit 610 (e.g., scanning user interface unit of the floorplan unit 242 of FIG. 2, and/or floorplan unit 342 of FIG. 3) can generate user interface data 612 using acquired image data 602 (e.g., depth data such as a 3D point cloud, RGB data, and the like) and/or acquired semantic segmentation data (e.g., RGB-S data that semantically labels objects and/or people within the image data). Image data 602, in the example environment 600, includes a couch 604. The couch 604 is an example piece of furniture that is shown to represent an object that may include areas that a user may not be able to capture sufficient data from one viewpoint or a quick scanning process (e.g., behind the couch cushions and/or pillows). The user interface data 612 includes user interface 606 as an example screenshot a user may see after scanning a portion of a room. For example, user interface 606 includes graphical indicator 614 which shows the area of the room that the user has scanned that provides sufficient amount of image data to generate an accurate floorplan. Additionally, user interface 606 includes graphical indicators 616a and 616b which each show areas of the room that the user has scanned that does not provide sufficient amount of image data to generate an accurate floorplan. Additionally, or alternatively, in some implementations, the user interface 606 could display a user interface element (e.g., an extended reality image, such as a 3D arrow overlaid on a live video stream) to indicate to scan the areas indicated by graphical indicators 616a and 616b. Thus, the user interface elements can indicate areas in the physical environment that may require additional scanning.

Figure 7:
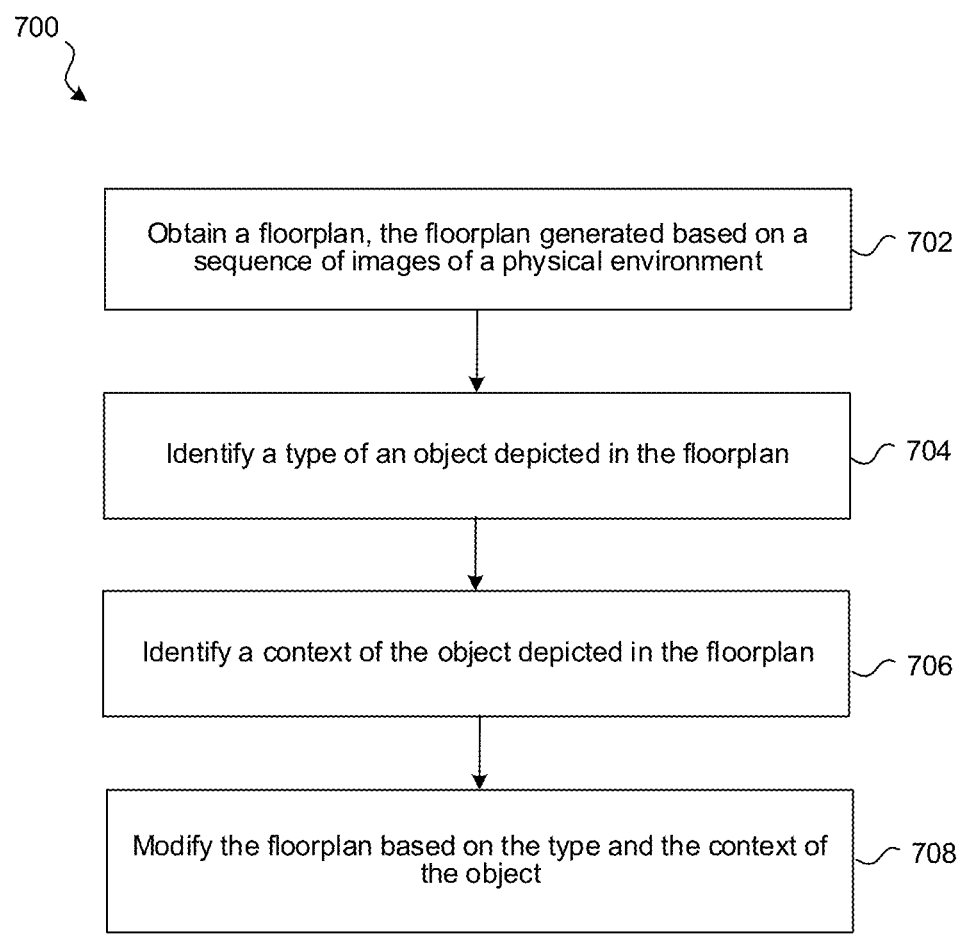
FIG. 7 is a flowchart representation of an exemplary method that modifies a floorplan based on a type and a context of an identified object in a physical environment in accordance with some implementations.

FIG. 7 is a flowchart representation of an exemplary method 700 that updates a floorplan by altering the objects in the floorplan based on their semantics and contexts (e.g., beautification) in accordance with some implementations. In some implementations, the method 700 is performed by a device (e.g., server 110 or device 120 of FIGS. 1-3), such as a mobile device, desktop, laptop, or server device. The method 700 can be performed on a device (e.g., device 120 of FIGS. 1 and 3) that has a screen for displaying images and/or a screen for viewing stereoscopic images such as a head-mounted display (HMD). In some implementations, the method 700 is performed by processing logic, including hardware, firmware, software, or a combination thereof. In some implementations, the method 700 is performed by a processor executing code stored in a non-transitory computer-readable medium (e.g., a memory). The process of updating a floorplan (e.g., beautification) of method 700 is illustrated with reference to FIG. 8.

At block 702, the method 700 obtains a floorplan, the floorplan generated based on a sequence of images of a physical environment. For example, the images can include of different parts of a room from multiple perspectives. In some implementations, the sequence of images of the physical environment includes depth data. In some implementations, identifying the type of the object depicted in the floorplan is based on semantic data. For example, segmentation data (e.g., semantic segmentation data such as RGB-S data) may be obtained from a segmentation unit that uses a machine learning model that is configured to identify semantic labels for pixels or voxels of image data.

At block 704, the method 700 identifies a type of an object depicted in the floorplan. For example, the method 700 may obtain or generate semantic labels to identify a table, chair, window, etc., based on the image intensity images (e.g., RGB data 403) and/or depth data (e.g., depth data 405).

At block 706, the method 700 identifies a context of the object depicted in the floorplan. For example, a table can be identified as near a wall or walls, a chair can be identified as associated with a table, or multiple of a same type of item (e.g., chairs, windows, and the like) can be identified within a threshold distance of one another.

At block 708, the method 700 modifies the floorplan based on the type and the context of the object. For example, the modifications can include aligning the table with the wall, aligning chairs around a table, resizing windows to match each other, moving a measurement value, etc. In some implementations, the object is a first object, and identifying the context of the first object includes determining that the first object is associated with a second object based on the identified type of the first object and an identified type of the second object depicted in the floorplan, wherein the identified type of the first object is different than the identified type of the second object. In some implementations, modifying the floorplan includes aligning the first object with the second object.

In some implementations, identifying the context of the object includes identifying a plurality of walls in the floorplan, and determining that the object is closer to a first wall than other identified walls of the plurality of walls. In some implementations, modifying the floorplan includes aligning the object with the first wall. For example, the beautification process may include aligning a table that is near a particular wall. Aligning a table may include centering the table based on the distance of the wall from a corner to a door on the wall, or centering the table with respect to the wall from a corner to an opposite corner distance on the wall. Additionally, or alternatively, aligning a table with a wall may include aligning a square or rectangular table such that it is parallel with the wall to make sure the floorplan doesn't include misaligned (e.g., crooked) furniture where possible. An oval table may be aligned based on the aligning the length (e.g., the longest straight-line distance of an oval) to be parallel with a wall. A circular table may be aligned based on having the center point at an equidistance from two adjacent walls.

In some implementations, the object is a first object, and identifying the context of the first object includes determining that the first object is associated with a second object based on the identified type of the first object and an identified type of the second object depicted in the floorplan, wherein the identified type of the first object is the same as the identified type of the second object. For example, the beautification process can include identifying of multiple objects of a same type of items within a threshold distance of one another (e.g., chairs, windows, etc.) and aligning them based on certain context-based rules. In some implementations, modifying the floorplan includes aligning the first object based on an alignment of the second object. For example, aligning a chair with an associated table. In some implementations, modifying the floorplan includes resizing the first object to match a size of the second object. For example, resizing a window to match an adjacent window.

In some implementations, the floorplan includes a measurement value associated with the object, wherein modifying the floorplan includes modifying the measurement value to align with the object or an identified wall. For example, the floorplan generation system can include measurements of objects and room features (e.g., furniture, doors, windows, etc.) placed around the objects and room features. The beautification process can modify the placement of those measurement values so that they align with the objects to make them more aesthetically pleasing to the user. Modifying the measurement values may include reducing the text size to fit better, aligning the text with the object to make them parallel with the object or adjacent walls, removing the values until the user clicks on a room feature or object that they desire to show the measurement values, and the like.

In use, for the process 700, the processes described herein for a beautification unit would acquire a floorplan, identify objects and associated context for each object depicted in the floorplan, and alter the objects in the floorplan based on their semantics and contexts (e.g., beautification). Thus, as shown and discussed below with reference to FIG. 8, a beautification unit 810 (e.g., beautification unit 244 of FIG. 2, and/or beautification unit 344 of FIG. 3) receives floorplan data (e.g. floorplan data 427 from floorplan generation unit 426) and alters the objects in the floorplan based on their semantics and contexts.

FIGS. 8A-B are block diagrams illustrating an example system flow of modifying a floorplan based on a type and a context of an identified object in a physical environment in accordance with some implementations. In particular, FIG. 8A illustrates an example environment 800A in which a beautification unit 810 (e.g., beautification unit 244 of FIG. 2, and/or beautification unit 344 of FIG. 3) can update a floorplan (e.g., floor data 812) from the example image 802 by altering the objects (e.g., dining room set 804a) in the floorplan based on their semantics and contexts (e.g., beautification) to create data 806 with the altered objects (e.g., dining room set 804b) that can be used to update a floorplan. For example, dining room set 804b is illustrated with each chair aligned and distributed about the table equally, with each chair being the same size and shape.

FIG. 8B illustrates an example environment 800B in which a beautification unit 810 (e.g., beautification unit 244 of FIG. 2, and/or beautification unit 344 of FIG. 3) can update a floorplan (e.g., floor data 814) from the example image 822 by altering the objects (e.g., bookcase 824a and windows 826a, 827a, and 828a) in the floorplan based on their semantics and contexts (e.g., beautification) to create data 825 with the altered objects (e.g., bookcase 824b and windows 826b, 827b, and 828b) that can be used to update a floorplan. For example, bookcase 824a (e.g., shown as crooked) can be altered by identifying a wall or floor that is closest to the bookcase 824a, and alter the bookcase to be properly aligned with an adjacent wall and/or an identified floor plane (e.g., bookcase 824b is shown as aligned with an adjacent wall, or perpendicular with a floor plane. Additionally, for example, windows 826a, 827a, and 828a, can be identified as a group or set of similar or identical windows in size and other characteristics (e.g., trim, style, etc.). The windows 826a, 827a, and 828a can be altered by the beautification unit 810 to be aligned with the walls and floor (e.g., at 90-degree angles, etc.) as shown with windows 826b, 827b, and 828c. Additionally, or alternatively, the windows 826a, 827a, and 828a can be altered by the beautification unit 810 to ensure they have similar size and make/model characteristics such that they are identical windows and identified as such in an associated floorplan.

FIGS. 8A-B are illustrated as 3D representations of the beautification process and what the beautification unit 810 is modifying. In the exemplary implementation, the algorithms of the beautification unit 810 (e.g., a machine learning model such as a neural network) is modifying 2D representations of the image data (e.g. the floorplan data). For example, as illustrated in FIG. 4, the beautification unit is modifying the crooked chairs illustrated in floorplan 427, to create the modified floorplan 445 with chairs that are aligned with the table in a 2D floorplan. Alternatively, the beautification unit 810 modifies 3D representation data as illustrated in example environments 800A and 800B.

Figure 9:
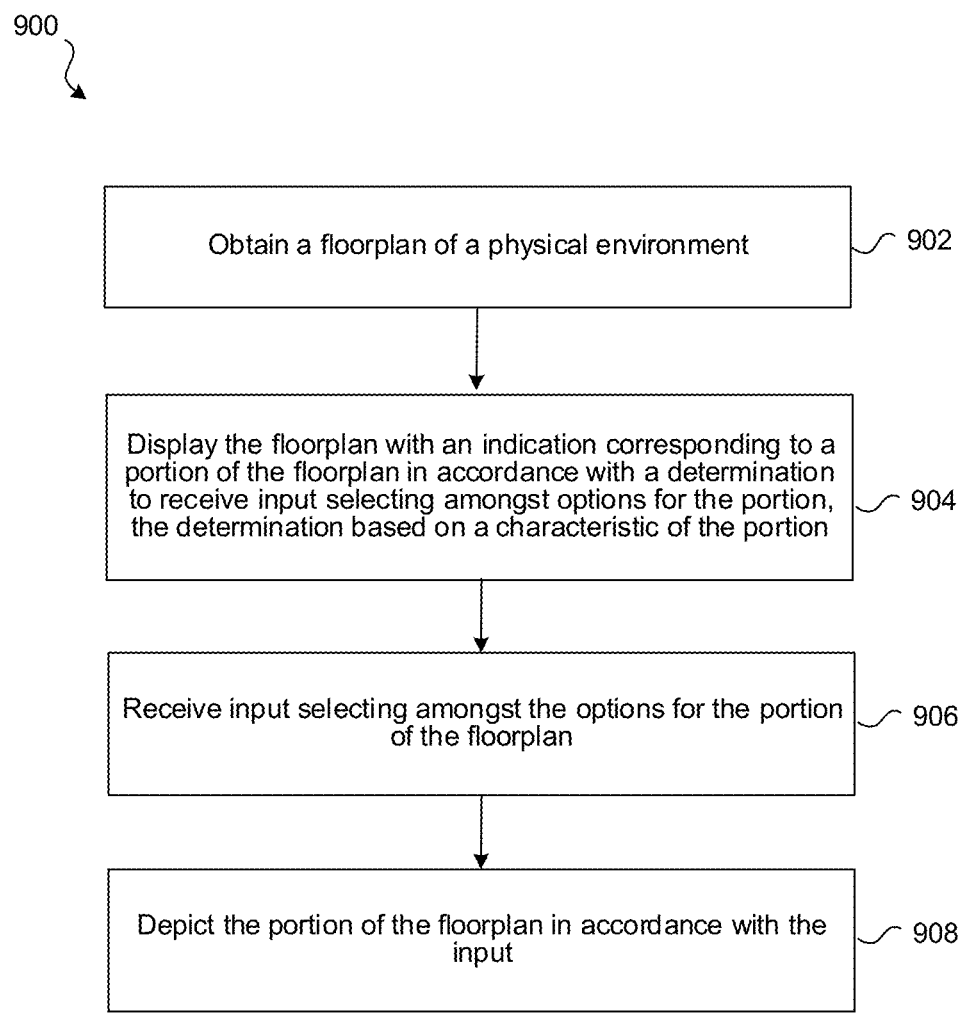
FIG. 9 is a flowchart representation of an exemplary method that provides a user interface that enables a user to resolve uncertainty/inaccuracies in a floorplan in accordance with some implementations.

FIG. 9 is a flowchart representation of an exemplary method 900 that provides a user interface that provides editing particular (e.g., identified) portions of a floorplan based on whether those particular portions as having potential uncertainty in accordance with some implementations.

In some implementations, the method 900 is performed by a device (e.g., server 110 or device 120 of FIGS. 1-3), such as a mobile device, desktop, laptop, or server device. The method 900 can be performed on a device (e.g., device 120 of FIGS. 1 and 3) that has a screen for displaying images and/or a screen for viewing stereoscopic images such as a head-mounted display (HMD). In some implementations, the method 900 is performed by processing logic, including hardware, firmware, software, or a combination thereof. In some implementations, the method 900 is performed by a processor executing code stored in a non-transitory computer-readable medium (e.g., a memory). The process of providing a user interface that provides editing of particular portions of a floorplan of method 900 is illustrated with reference to FIG. 10.

At block 902, the method 900 obtains a floorplan of a physical environment. For example, the floorplan may be generated based on light intensity image data (e.g., RGB data) and depth data (e.g., from a depth sensor or extrapolated from the light intensity image data) of different parts of a room from multiple perspectives.

In some implementations, the floorplan is generated based on depth data. In some implementations, determining to receive the input is based on an amount of information available for the portion. In some implementations, determining to receive the input is based on a size of an element depicted in the portion. For example, a large wall may be modeled as multiple walls due to inherent drift in data over time. In some implementations, determining to receive the input is based on a confidence value of an element depicted in the portion.

At block 904, the method 900 displays the floorplan with an indication corresponding to a portion of the floorplan in accordance with a determination to receive input selecting amongst options for the portion, the determination based on a characteristic of the portion. For example, the indication may identify that a user may provide input to confirm an option or select an alternative option. In some implementations, the indication may identify a primary option and an alternative option using distinguishing characteristics, e.g., a dotted line. Additionally, or alternatively, the indication may enable access to a drop-down list of couch, table, lounge chair, etc. for selection for an object.

In some implementations, the method 900 determines to receive input selecting amongst options for a portion of floorplan based on a characteristic of the portion. For example, the characteristics may be based on lack of information about the portion, such as not enough image information was obtained during a scanning process. Additionally, or alternatively, the characteristics may be based on not having enough information about an object or wall that is assumed to be in the portion. Additionally, or alternatively, the characteristics may be based on inherent flaws in the system. For example, a large wall may be modeled as multiple walls due to inherent drift in data over time.

In some implementations, the method 900 determines the options for the portion of floorplan. For example, options for the portion of the floorplan could include the portion has no wall versus the portion has a wall, the portion has a single wall versus the portion has two walls, an object is table, a couch, a chair, etc., or the portion is a door that opens on its left edge versus but the door should open on its right edge.

In some implementations, a first option of the options includes a wall in the portion of the floorplan and the second option of the options excludes the wall from the portion of the floorplan. In some implementations, a first option of the options includes a first type of object in the portion and the second option of the options includes a second type of object in the portion. In some implementations, a first option of the options includes a door oriented in a first direction in the portion and the second option of the options includes the door oriented in a second, different direction in the portion. In some implementations, the indication provides a selectable list of the options.

At block 906, the method 900 receiving input selecting amongst the options for the portion of the floorplan. For example, the input may confirm a primary option, select an alternative option, or select from a dropdown menu of possible options.

At block 908, the method 900 depicts the portion of the floorplan in accordance with the input. For example, the floorplan may remain the same if the user confirms a primary option, or the floorplan can be modified if the user selects an alternative option, such as changing the indication of a couch to a chair.

In use, for the process 900, the processes described herein for a refinement unit would acquire a floorplan (or a modified floorplan from the beautification unit), identify areas of uncertainty using methods discussed herein, and provide a user interface that provides editing particular (e.g., identified) portions of the floorplan based on whether those particular portions were identified with potential uncertainty. Thus, as shown and discussed below with reference to FIG. 10, an editing user interface unit 1010 of a refinement unit (e.g., refinement unit 246 of FIG. 2, and/or refinement unit 346 of FIG. 3) receives modified floorplan data (e.g. modified floorplan data 432 from beautification unit 430), refines the objects in the floorplan based on user selections in the editing user interface, and generates refined floorplan data (e.g., refined floorplan 444).

Figure 10:
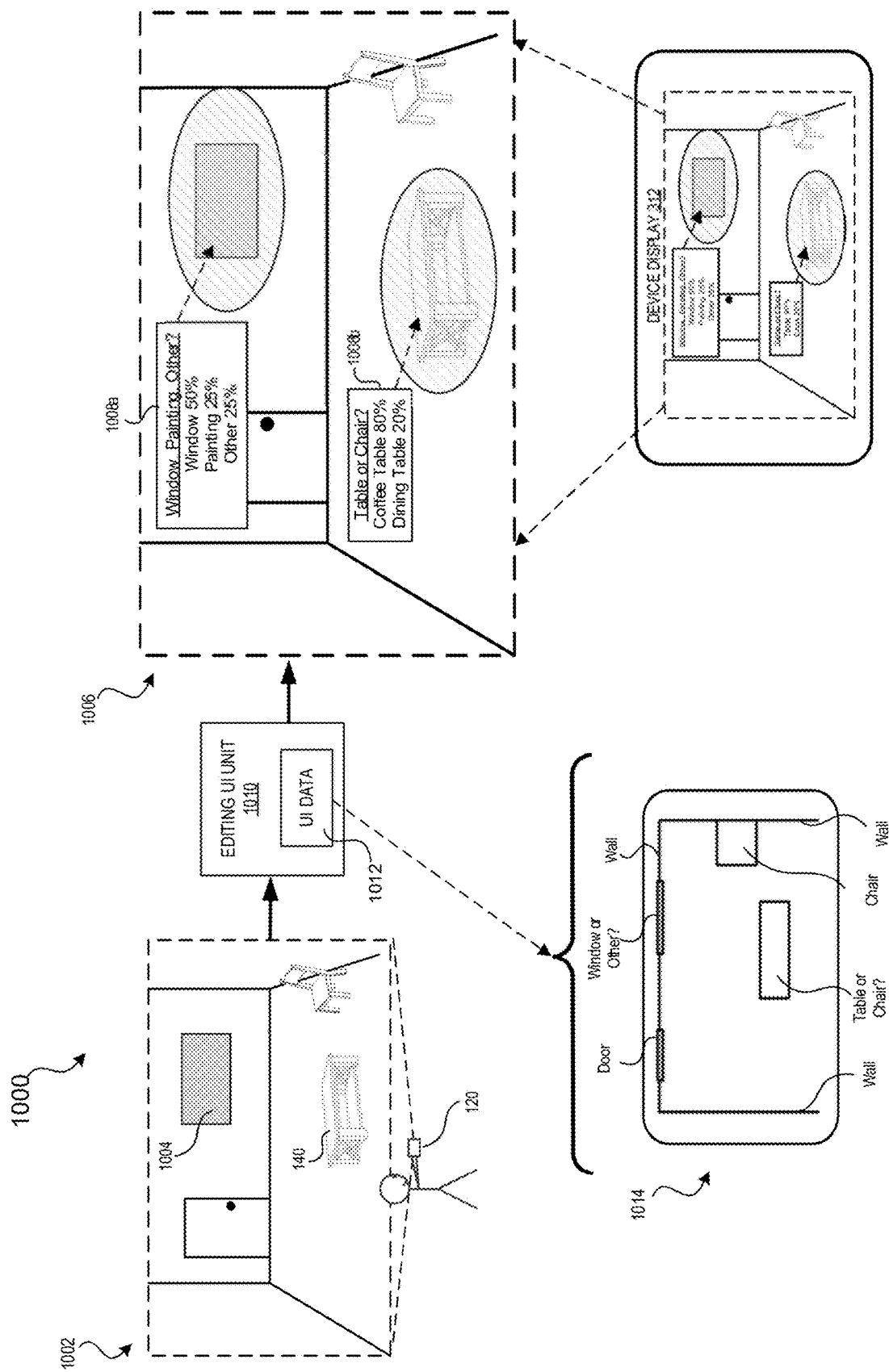
FIG. 10 is a block diagram illustrating an example system flow of providing a user interface that enables a user to resolve uncertainty/inaccuracies in a floorplan in accordance with some implementations.

FIG. 10 is a block diagram illustrating an example system flow of providing a user interface that enables a user to resolve uncertainty/inaccuracies in a floorplan in accordance with some implementations. In particular, FIG. 10 illustrates an example environment 1000 in which an editing user interface unit 1010 (e.g., editing user interface unit of the refinement unit 242 of FIG. 2, and/or refinement unit 342 of FIG. 3) can generate user interface data 1012 that includes floorplan 1014 using acquired image data 1002 (e.g., depth data such as a 3D point cloud, RGB data, and the like) and/or acquired semantic segmentation data (e.g., RGB-S data that semantically labels objects and/or people within the image data). In an exemplary implementation, as discussed herein with reference to FIG. 4, the editing user interface unit 1010 can acquire a modified floorplan from beautification unit 430 as opposed to generating a floorplan from image data 1002. Image data 1002, in the example environment 1000, includes table 140 and chair 142 from example environment 105 of FIG. 1, but further includes window 1004. The window 1004 is an example room feature (e.g., door, window, wall, etc.) that is shown to represent an area that may include an object or room feature that is identified as an area of uncertainty (e.g., likely a window, but could be identified as a painting, a television, etc.). The user interface data 1012 includes user interface 1006 as an example screenshot a user may see after scanning a room (e.g., room as viewed in image 1002 by device 120). For example, user interface 1006 includes feedback element 1008a which shows the area of the room (e.g., window 1004) that the user has scanned that identifies an area of uncertainty that includes an object (or room feature). As illustrated, feedback element 1008a identifies for a user an area of uncertainty (e.g., an oval around the object/feature), and provides a list of potential choices the editing user interface unit 1010 has generated based on the obtained floorplan data. The feedback element 1008a provides a selectable list that the user can select from for the window 1004 as well as the percentages of likelihood associated with each choice, such as a window 50%, painting 25%, or other 25%. User interface 1006 further includes feedback element 1008b which shows the area of the room (e.g., table 140) that the user has scanned that identifies an area of uncertainty that includes an object (or room feature). As illustrated, feedback element 1008b identifies for a user an area of uncertainty (e.g., an oval around the object/feature), and provides a list of potential choices the editing user interface unit 1010 has generated based on the obtained floorplan data. The feedback element 1008b provides a selectable list that the user can select from for the table 140 as well as the percentages of likelihood associated with each choice, such as a coffee table 80%, or dining table 20%.

Additionally, or alternatively, in some implementations, the feedback element 1008 of the user interface 1006 can allow a user to enter (e.g., type) in a label for the object if there is not a correct one listed. Additionally, or alternatively, in some implementations, the user interface 1006 can allow a user to select other objects/features not identified by a feedback element 1008, and can update those labels as well for the refined floorplan data. For example, if chair 142 was labeled as a love seat chair in the floorplan, a user could select the area of the chair in the user interface 1006, and an interactive window could allow a user to update the associated label for the chair 142.

Additionally, or alternatively, in some implementations, the feedback element 1008 of the user interface 1006 can be displayed in response to a user selection. For example, a user can tap the associated object. Additionally, or alternatively, in some implementations, instead of a displayed window of possibilities such as feedback element 1008a, a selection (e.g., tap) can toggle through the various options. For example, a user can be shown a window (e.g., feedback element 1008a) for the window/painting, then tap on the table to show another window (e.g., feedback element 1008b) and the first window (e.g., feedback element 1008a) would leave the user interface.

In some implementations, the editing features are shown to the user in a 2D representation such as a floorplan (e.g., floorplan 1014). For example, feedback element 1008a would be shown as associated to the window of floorplan 1014 on the user interface.

In some implementations, wall segments can also be edited, added, and/or removed. For example, in the 2D layout view (e.g., floorplan 1014), there may be sections of the wall that the system is not certain about and the user interface can highlight that in some way to the user (e.g., feedback element 1008a). If the wall should or should not be there, the user can tap on the highlighted segment and the device will toggle the presence of a wall within the layout of the floorplan.

Numerous specific details are set forth herein to provide a thorough understanding of the claimed subject matter. However, those skilled in the art will understand that the claimed subject matter may be practiced without these specific details. In other instances, methods apparatuses, or systems that would be known by one of ordinary skill have not been described in detail so as not to obscure claimed subject matter.

Unless specifically stated otherwise, it is appreciated that throughout this specification discussions utilizing the terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more implementations of the present subject matter. Any suitable programming, scripting, or other type of language or combinations of languages may be used to implement the teachings contained herein in software to be used in programming or configuring a computing device.

Implementations of the methods disclosed herein may be performed in the operation of such computing devices. The order of the blocks presented in the examples above can be varied for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or value beyond those recited. Headings, lists, and numbering included herein are for ease of explanation only and are not meant to be limiting.

It will also be understood that, although the terms "first," "second," etc. may be used herein to describe various elements, these elements should not be limited by these terms. These terms are only used to distinguish one element from another. For example, a first node could be termed a second node, and, similarly, a second node could be termed a first node, which changing the meaning of the description, so long as all occurrences of the "first node" are renamed consistently and all occurrences of the "second node" are renamed consistently. The first node and the second node are both nodes, but they are not the same node.

The terminology used herein is for the purpose of describing particular implementations only and is not intended to be limiting of the claims. As used in the description of the implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description and summary of the invention are to be understood as being in every respect illustrative and exemplary, but not restrictive, and the scope of the invention disclosed herein is not to be determined only from the detailed description of illustrative implementations but according to the full breadth permitted by patent laws. It is to be understood that the implementations shown and described herein are only illustrative of the principles of the present invention and that various modification may be implemented by those skilled in the art without departing from the scope and spirit of the invention.

What is claimed is:

1. A method comprising:
   at an electronic device having a processor:
   obtaining a live camera feed comprising a sequence of images of a physical environment, the physical environment including a first object and a second object;
   obtaining depth data of at least a portion of the physical environment via a depth sensor during the obtaining of the live camera feed, wherein the depth data of the least a portion of the physical environment includes at least a portion of the first object and at least a portion of the second object;
   identifying an area of occlusion in which the first object blocks a view of the second object in the live camera feed based on the depth data;
   determining a first portion and a second portion of the physical environment based on determining that the first portion satisfies a condition and the second portion does not satisfy the condition based at least in part on the identified area of occlusion, the condition corresponding to generating a floorplan; and
   displaying a user interface comprising the live camera feed with a graphical indicator based on the first portion and the second portion.

2. The method of claim 1, wherein determining that the first portion satisfies the condition is based on determining that an amount of depth data available for the first portion is greater than a threshold.

3. The method of claim 1, wherein determining that the first portion satisfies the condition is based on determining that an angle of incidence associated with the depth data is less than a threshold.

4. The method of claim 1, wherein determining that the first portion satisfies the condition is based on an acquisition distance between the device and the first portion when the depth sensor obtained the depth data.

5. The method of claim 1, wherein determining that the first portion satisfies the condition and the second portion does not satisfy the condition comprises determining confidence scores associated with the first portion and second portion.

6. The method of claim 1, wherein the graphical indicator comprises a painting effect that distinguishes the first portion from the second portion of the physical environment.

7. The method of claim 1, wherein the graphical indicator indicates areas of the physical environment for additional scanning.

8. The method of claim 1, wherein the graphical indicator comprises a time-based effect in a direction corresponding to areas of the physical environment for additional scanning.

9. A device comprising:
   a non-transitory computer-readable storage medium; and
   one or more processors coupled to the non-transitory computer-readable storage medium, wherein the non-transitory computer-readable storage medium comprises program instructions that, when executed on the one or more processors, cause the one or more processors to perform operations comprising:
   obtaining a live camera feed comprising a sequence of images of a physical environment, the physical environment including a first object and a second object;
   obtaining depth data of at least a portion of the physical environment via a depth sensor during the obtaining of the live camera feed, wherein the depth data of the least a portion of the physical environment includes at least a portion of the first object and at least a portion of the second object;
   identifying an area of occlusion in which the first object blocks a view of the second object in the live camera feed based on the depth data;
   determining a first portion and a second portion of the physical environment based on determining that the first portion satisfies a condition and the second portion does not satisfy the condition based at least in part on the identified area of occlusion, the condition corresponding to generating a floorplan; and
   displaying a user interface comprising the live camera feed with a graphical indicator based on the first portion and the second portion.

10. The device of claim 9, wherein determining that the first portion satisfies the condition is based on determining that an amount of depth data available for the first portion is greater than a threshold.

11. The device of claim 9, wherein determining that the first portion satisfies the condition is based on determining that an angle of incidence associated with the depth data is less than a threshold.

12. The device of claim 9, wherein determining that the first portion satisfies the condition is based on an acquisition distance between the device and the first portion when the depth sensor obtained the depth data.

13. The device of claim 9, wherein determining that the first portion satisfies the condition and the second portion does not satisfy the condition comprises determining confidence scores associated with the first portion and second portion.

14. The device of claim 9, wherein the graphical indicator comprises a painting effect that distinguishes the first portion from the second portion of the physical environment.

15. The device of claim 9, wherein the graphical indicator indicates areas of the physical environment for additional scanning.

16. The device of claim 9, wherein the graphical indicator comprises a time-based effect in a direction corresponding to areas of the physical environment for additional scanning.

17. A non-transitory computer-readable storage medium storing program instructions that are computer-executable to perform operations comprising:
   obtaining a live camera feed comprising a sequence of images of a physical environment, the physical environment including a first object and a second object;
   obtaining depth data of at least a portion of the physical environment via a depth sensor during the obtaining of the live camera feed, wherein the depth data of the least a portion of the physical environment includes at least a portion of the first object and at least a portion of the second object;

identifying an area of occlusion in which the first object blocks a view of the second object in the live camera feed based on the depth data;

determining a first portion and a second portion of the physical environment based on determining that the first portion satisfies a condition and the second portion does not satisfy the condition based at least in part on the identified area of occlusion, the condition corresponding to generating a floorplan; and displaying a user interface comprising the live camera feed with a graphical indicator based on the first portion and the second portion.

18. The non-transitory computer-readable storage medium of claim 17, wherein determining that the first portion satisfies the condition is based on determining that an amount of depth data available for the first portion is greater than a threshold.

19. The non-transitory computer-readable storage medium of claim 17, wherein determining that the first portion satisfies the condition is based on determining that an angle of incidence associated with the depth data is less than a threshold.

20. The non-transitory computer-readable storage medium of claim 17, wherein determining that the first portion satisfies the condition is based on an acquisition distance between a device and the first portion when the depth sensor obtained the depth data.

* * * * *